(12) United States Patent
Weidlich

(10) Patent No.: US 11,871,680 B2
(45) Date of Patent: Jan. 9, 2024

(54) DEVICE FOR GUIDING CHARGE CARRIERS AND USE THEREOF

(71) Applicant: Helmut Weidlich, Unkel (DE)

(72) Inventor: Helmut Weidlich, Unkel (DE)

(*) Notice: Subject to any disclaimer, the term of this patent is extended or adjusted under 35 U.S.C. 154(b) by 842 days.

(21) Appl. No.: 16/963,031

(22) PCT Filed: Jan. 15, 2019

(86) PCT No.: PCT/EP2019/050936
§ 371 (c)(1),
(2) Date: Jul. 17, 2020

(87) PCT Pub. No.: WO2019/141677
PCT Pub. Date: Jul. 25, 2019

(65) Prior Publication Data
US 2020/0350492 A1   Nov. 5, 2020

(30) Foreign Application Priority Data

Jan. 19, 2018   (EP) ..................................... 18152514
Oct. 31, 2018   (EP) ..................................... 18000852

(51) Int. Cl.
*H10N 50/85* (2023.01)
*H10N 15/10* (2023.01)
*H10N 50/80* (2023.01)
*B82Y 30/00* (2011.01)

(52) U.S. Cl.
CPC ............. *H10N 50/85* (2023.02); *H10N 15/15* (2023.02); *H10N 50/80* (2023.02); *B82Y 30/00* (2013.01)

(58) Field of Classification Search
CPC ........ H10N 50/85; H10N 15/15; H10N 50/80; H10N 50/10; H10N 15/00; B82Y 30/00
See application file for complete search history.

(56) References Cited

U.S. PATENT DOCUMENTS

2007/0085544 A1   4/2007   Viswanathan
2009/0152606 A1   6/2009   Koo et al.

FOREIGN PATENT DOCUMENTS

| CA | 2972678 A1 * | 7/2016 | ........... G01R 33/035 |
|----|--------------|--------|------------------------|
| CN | 106898433 A | 6/2017 | |
| DE | 3903919 A1 | 8/1990 | |
| EP | 2693501 A2 | 2/2014 | |
| KR | 20090008009 A | 1/2009 | |
| WO | WO 2012127245 A2 | 9/2012 | |

(Continued)

OTHER PUBLICATIONS

International Search Report and Written Opinion for International Application No. PCT/EP2016/025000 dated May 2, 2016.

(Continued)

*Primary Examiner* — Mohamad A Musleh
(74) *Attorney, Agent, or Firm* — Andrus Intellectual Property Law, LLP

(57) ABSTRACT

A device for guiding charge carriers and uses of the device are proposed, wherein the charge carriers are guided by means of a magnetic field along a curved or angled main path in a two-dimensional electron gas, in a thin superconducting layer or in a modification of carbon with a hexagonal crystal structure, so that a different presence density is produced at electrical connections.

32 Claims, 18 Drawing Sheets

(56) References Cited

FOREIGN PATENT DOCUMENTS

WO    WO 2013016601 A1    1/2013
WO    WO 2016113141 A1    7/2016

OTHER PUBLICATIONS

International Search Report and Written Opinion for International Application No. PCT/EP2019/050936 dated Jun. 14, 2019.
Wang, Chuan-Kui et al.; "Quantum bound states in a double-bend quantum channel"; Journal of Applied Physics; Mar. 15, 1995; pp. 2564-2571; vol. 77, No. 6.
Nii, Masahiro et al.; "Three-dimensional model for numerical electromagnetic field analyses of coated superconductors and its application to Roebel cables"; Superconductor Science and Technology; Jul. 6, 2012; vol. 25, No. 9; Great Britain.
Wang, Chuan-Kui et al.; "Quantum bound states in a ballistic quantum channel with a multiple double-bend discontinuity"; Semicond. Sci. Technol.; Jan. 1, 1995; pp. 1131-1138; United Kingdom.

\* cited by examiner

DEVICE FOR GUIDING CHARGE CARRIERS AND USE THEREOF

CROSS-REFERENCE TO RELATED APPLICATIONS

This application is the U.S. national stage application of International Application PCT/EP2019/050936, filed Jan. 15, 2019, which international application was published on Jul. 25, 2019, as International Publication WO 2019/141677 A1 in the English language. The International Application claims priority of EP Patent Application 18152514.8, filed Jan. 19, 2018 and EP Patent Application No. 18000852.6 filed Oct. 31, 2018.

The present invention relates to a device for guiding carriers, each of which has an electrical charge and/or a magnetic moment, particularly charge carriers, especially preferably electrons, according to the preamble of claim 1 or 12, as well as to uses of the device.

For the vast majority of all objects in the real world in which groups or ensembles of particles (e.g., gas molecules in a volume, electrons in a solid, etc.) are moving, these particles are subject to the so-called ergodic theorem. This means that, theoretically, when observed for a sufficient length of time, every possible point in the phase space (of spatial and momentum coordinates) of this system will be reached with the same frequency. The laws of thermodynamics, particularly the first and second laws, apply to such systems.

Non-ergodic systems have mostly only been known in theory. For example, a pool table with ideally parallel walls and a frictionlessly rolling ball represents such a non-ergodic system if the ball is tossed from the center of the table exactly perpendicularly to one of the bordering walls and reflected off the bordering walls ideally perpendicularly to the wall. In this case, the ball would always roll back and forth only on the connecting line between the two ideally parallel walls but never reach the other areas of the pool table.

In the cited example, the conditions for the occurrence of the non-ergodic system are considerable, to wit: the shape of the bordering walls must be ideally parallel, the shape of the path of the particle (ball) must be ideally straight, the reflection off the walls must be ideally perpendicular, the initial direction of motion must be ideally perpendicular to the wall, and there must be no variation on the path without contact with bordering walls. Such conditions can rarely be achieved in practice.

The present invention deals with such non-ergodic systems, with possible implementations and applications being indicated.

DE 39 03 919 A1 discloses a device and a method for guiding electrons in a solid, wherein a thin semiconductor layer is applied to a spherically curved surface of an electrical insulator. By means of a magnetic field, the radius of curvature of the path of the electrons in the layer is brought to the same or similar order of magnitude as the radius of curvature of the layer. A difference in potential is tapped between two spaced-apart points on the curved layer. The dimensions, particularly the thickness of the semiconductor layer, must lie in the order of magnitude of the mean free path length of the electrons in the semiconductor layer, which are very small in a homogeneous semiconductor layer, which renders implementation difficult.

The articles "Quantum bound states in a ballistic quantum channel with a multiple double-bend discontinuity" by Chuan-Kui Wang, Semicond. Sci. Technol., 1 Jan. 1995, pages 1131-1138, and "Quantum bound states in a double-bend quantum channel" by Chuan-Kui Wang et al., Journal of Applied Physics, Vol. 77, no. 6, 1 Jan. 1995, pages 2564-2571, deal with quantum states of an electron gas in a narrow channel with oppositely double-curved discontinuity without the influence of an external field and without an examination of direction-dependent conductivities. Moreover, the channel width must lie substantially below the de Broglie wavelength of the electrons in order to achieve the desired quantum-mechanical behavior.

WO 2016/113141 A1 discloses a device for guiding carriers, each of which has an electrical charge or a magnetic moment, particularly charge carriers, preferably electrons. The device comprises a guide device for movably guiding the carriers in a movement region with a curved or angled main path, and a field-generating means for generating a field for guiding the carriers at least substantially along the main path, particularly so that electrical voltage or power can be tapped at electrical connections and/or the carriers have a different probability density/presence density at the electrical connections. The guide device has or forms a two-dimensional electron gas or a thin superconducting layer for forming the movement region. The guide device and/or movement region and/or main path extend at least substantially in a plane or along a closed surface and is curved and/or angled in this plane or surface.

It is the object of the present invention to provide a device for guiding carriers, each of which has an electrical charge and/or a magnetic moment, particularly charge carriers, especially preferably electrons, as well as uses of such devices, with a simple construction and simple manufacture being enabled and various possible applications being indicated.

The aforementioned object is achieved by a device according to claim 1 or 12 or through the use of a device according to any one of claims 28 to 32. Advantageous embodiments are subject of the subclaims.

The device preferably has a guide device which has or forms a two-dimensional electron gas, a thin, superconducting layer or is formed by any other material which exhibits a sufficiently large mean free path length for the carriers for the formation of a movement region for the mobile carriers. Other examples for materials having relatively or sufficiently large mean free path lengths for the carriers, particularly for electrons, are—preferably two-dimensional—modifications or allotropes of carbon with a hexagonal crystal structure, e. g. graphene or nanotubes, nanotubes formed from atoms other than carbon atoms and so-called "two-dimensional materials" or materials which can form van der Waals heterostructures (also called van der Waals materials), in particular materials formed by one or several single atomic layers. The large mean free path lengths enable the desired movement region to be achieved in a very simple manner. The width of the movement region and its radius of curvature are, particularly, in the order of magnitude of the mean free path length but still above the de Broglie wavelength of the carriers or electrons in the movement region. This sizing is especially advantageous for producing the desired non-ergodic system for the carriers.

The carriers move in the guide device and in the movement region at a mean speed that is also dependent on the thermal energy.

The movement region forms or delimits a curved or angled main path for the carriers. Using a field-generating means, a field—particularly magnetic field—for guiding the carriers at least substantially along the main path can be generated. Accordingly, the carriers are able to move at least substantially freely, i.e., virtually avoiding or minimizing impacts, in a direction that is at least substantially along the main path or parallel thereto. In the opposite direction, however, the carriers are deflected particularly in the direction of lateral flanks of the movement region. Consequently, there are a substantially greater number of impacts and reflections at boundary surfaces in the opposite direction. Also, in particular, due to the occurrence of wall impacts that are at least partially not strictly specular, are not scattering according to a sine angular distribution or are particularly diffusely scattering, this leads to a non-uniform distribution of the carriers and hence results in a different probability of presence or probability density/presence density of the carriers in the area of the start and end of the main path or along the main path. In particular, according to the proposal, a different conductivity is produced depending on the direction, with the conductivity along the main path ("following" the field) being preferably greater than the conductivity in the opposite direction.

The main path is particularly at least substantially a main direction of extension of the movement region and/or a path of motion that is followed in the ideal case by a carrier in a direction in the movement region in consideration of the acting field neglecting impacts. The main path therefore lies particularly on the main plane of the movement region and within the movement region, preferably at least substantially along a bent (deflected) center line of the movement region.

Each of the carriers preferably carries an electrical charge, particularly electrons or, alternatively, so-called holes or electron holes. Thus, an electrical voltage, an electric current, and/or an electric power can be tapped, based on the different probability of presence or probability density/ presence density of the carriers, by means of electrical connections arranged appropriately along the main path. This has been confirmed by experiments.

In principle, it is also possible for the carriers to each have a magnetic moment and interact with an electrical and/or magnetic field.

According to one aspect of the present invention, the guide device has or forms a material exhibiting a sufficiently large mean free path length for the carriers, in particular one or several layers or strips of graphene and/or one or several carbon nanotubes, for forming the movement region. These materials are advantageous for a cost-efficient manufacturing of the device and provide large mean free path lengths for the carriers.

According to another aspect of the invention which can also be implemented independently, the guide device has or is formed by one or several layers of a van der Waals heterostructure for forming the movement region. Preferably, the movement region comprises or is formed by a, particularly two-dimensional, modification of an element of the fourth main group of the periodic table of elements, in particular with a hexagonal crystal structure. These materials are advantageous for a cost-efficient manufacturing of the device and provide large mean free path lengths for the carriers.

According to another aspect of the invention which can also be implemented independently, the guide device has or is formed by a nanotube for forming the movement region. The nanotube is preferably formed from an element of the fourth main group or carbon group of the periodic table of elements, in particular tin, silicon or germanium. However, nanotubes formed from other elements or compounds can also be used. Nanotubes are advantageous for a cost-efficient manufacturing of the device and provide large mean free path lengths for the carriers.

According to a further aspect which can also be implemented independently that the guide device has or is formed by a material which exhibits large mean free path lengths for the carriers in the bulk material together with at least partially inelastic collisions or scattering at boundaries and/or in the bulk of the material. This is conducive to the efficiency of the device.

According to a preferred embodiment, the guide device has or is formed by one or several graphene layers or strips shaped as a spiral or helix and/or by one or several carbon nanotubes forming a spiral or helix for forming the movement region. It is also possible for several guide devices to be designed in this way. This allows for realizing a large number of guide devices or movement regions in a simple and cost-efficient way.

According to another aspect of the present invention which can also be implemented independently, the device comprises several guide devices and/or main paths which are arranged helix-like on top of one another along a common axis. This is conducive to a compact design of the device.

According to another aspect which can also be implemented independently, the device comprises a multitude of guide devices in a common plane, in particular wherein the guide devices are connected serially and/or in parallel. Such a design is advantageous for a cost-efficient manufacturing of the device.

In a further aspect which can also be implemented independently, the device comprises several guide devices and/ or main paths which are connected serially and/or in parallel by strip-like connecting devices. In a preferred aspect, the guide devices and/or main paths directly lead to the connecting devices in an acute angle or parallel to the longitudinal extension of the connected connecting device(s). In this way, a large number of guide devices can be connected in a simple and cost-efficient way.

According to a further aspect which can also be implemented independently, the guide device comprises a layer system of semiconductor-pairings which have shown to comprise long free mean path lengths for electrons. Examples for such pairings are GaAs paired with AlGaAs, in particular $Al_{0.33}Ga_{0.67}As$, or InGaAs paired with InP. Thus, particularly preferably, the guide device comprises a layer system with at least one layer of InGaAs and at least one layer of InP so that a two-dimensional electrongas is formed at the interface between the InGaAs layer and the InP layer.

Preferably, the guide device and/or the movement region preferably extends at least substantially along a closed, flat, or spherical surface or on a plane and is curved or angled in this surface or plane. This makes it possible in a relatively simple manner, particularly by means of planar layers, to construct and manufacture a proposed device, even with very small dimensions, preferably with a mean radius of curvature of the main path of less than 2000 nm and/or with a mean width of the guide device or movement region of less than 2000 nm.

According to another, independent aspect of the present invention, the proposed device can be used to generate an electrical voltage, particularly direct-current voltage, and power from the thermal or heat energy of charge carriers and/or from the electromagnetic inherent or ambient noise and/or from electromagnetic influence or radiation by tapping the voltage or power via the connections.

Preferably, the field or magnetic field for guiding the charge carriers is held at least substantially constant. Alternatively or in addition, a control or regulation of the field or magnetic field can be done such that the tapped voltage or electrical power is held at a target value or maximum value.

Another aspect of the present invention is that the proposed device can be used for cooling through the removal of thermal energy from charge carriers by tapping electrical power via the connections. This is very easy to implement and can, in principle, be used for a wide variety of purposes.

Here, preferably, the field or magnetic field for guiding the charge carriers is held at least substantially constant. Alternatively or in addition, a control or regulation of the field or magnetic field can be done such that the tapped electrical voltage or power is held at a target value or maximum value.

According to another aspect of the present invention, the proposed device can also be used to measure or detect electromagnetic inherent or ambient noise of charge carriers or of electromagnetic radiation by measuring an electrical voltage via the connections. Through the measurement of the voltage, the noise or the electromagnetic radiation can then be detected or determined.

In particular, the field or magnetic field or the acting magnetic field strength is held at least substantially constant during the abovementioned measurement. With proper calibration, it is then possible to very easily detect or determine the noise or an acting electromagnetic radiation. In principle, however, the field or magnetic field for guiding the carriers can also be varied.

According to another aspect of the present invention, the proposed device can also be used to measure or determine scattering or trajectories of charge carriers by measuring an electrical voltage via the connections. In particular, the measured voltage can provide information on conditions of the guide device or in the movement space.

In general, the proposed device can be used to measure or determine physical characteristics within a one- or two-dimensional electron gas or superconductor.

When measuring or determining scattering, trajectory, and/or (other) physical characteristics, the field or magnetic field guiding the charge carriers can be held at least substantially constant and/or varied over space and/or time as needed. With proper calibration, the desired measurements or determinations can be very easily performed in consideration of the measured voltages.

Moreover, it is possible to use the device without field-generating means to measure magnetic field strengths acting on the guide device by measuring the electrical voltage via the connections. Particularly if calibration is performed beforehand, a measurement of magnetic field strengths is possible.

Individual aspects and features of the present invention cited above and following below can be combined with one another as desired or also implemented independently of one another.

Other aspects, features, advantages, and characteristics of the present invention follow from the claims and the following description of preferred embodiments with reference to the drawing.

In the figures, same or similar components and devices are designated by the same reference symbols, with the same or analogous advantages and characteristics being achieved even if a repeated description is omitted.

Figure 1:
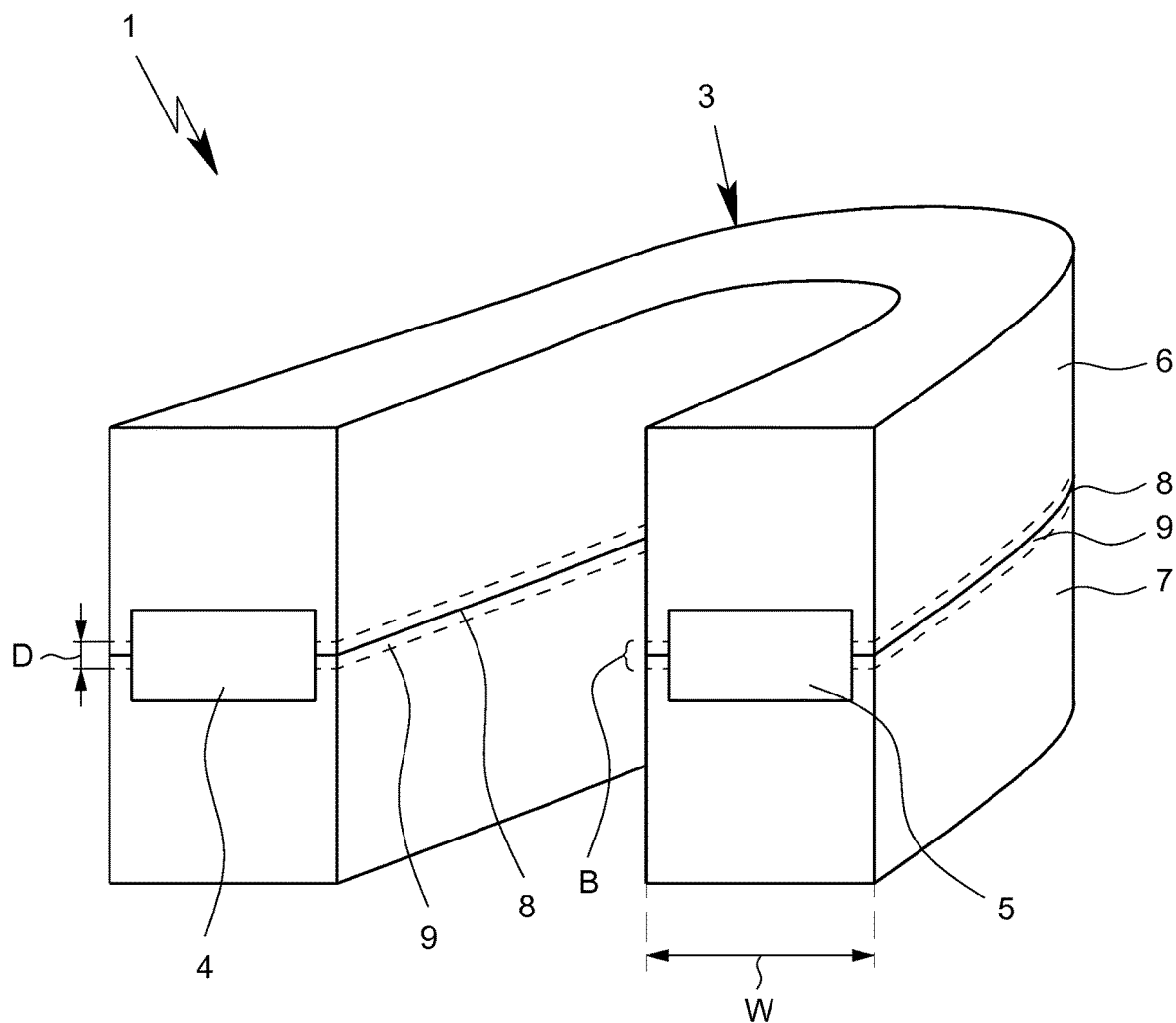
FIG. 1 shows a perspective view of a proposed device, but without field-generating means, according to a first embodiment.
Figure 2:
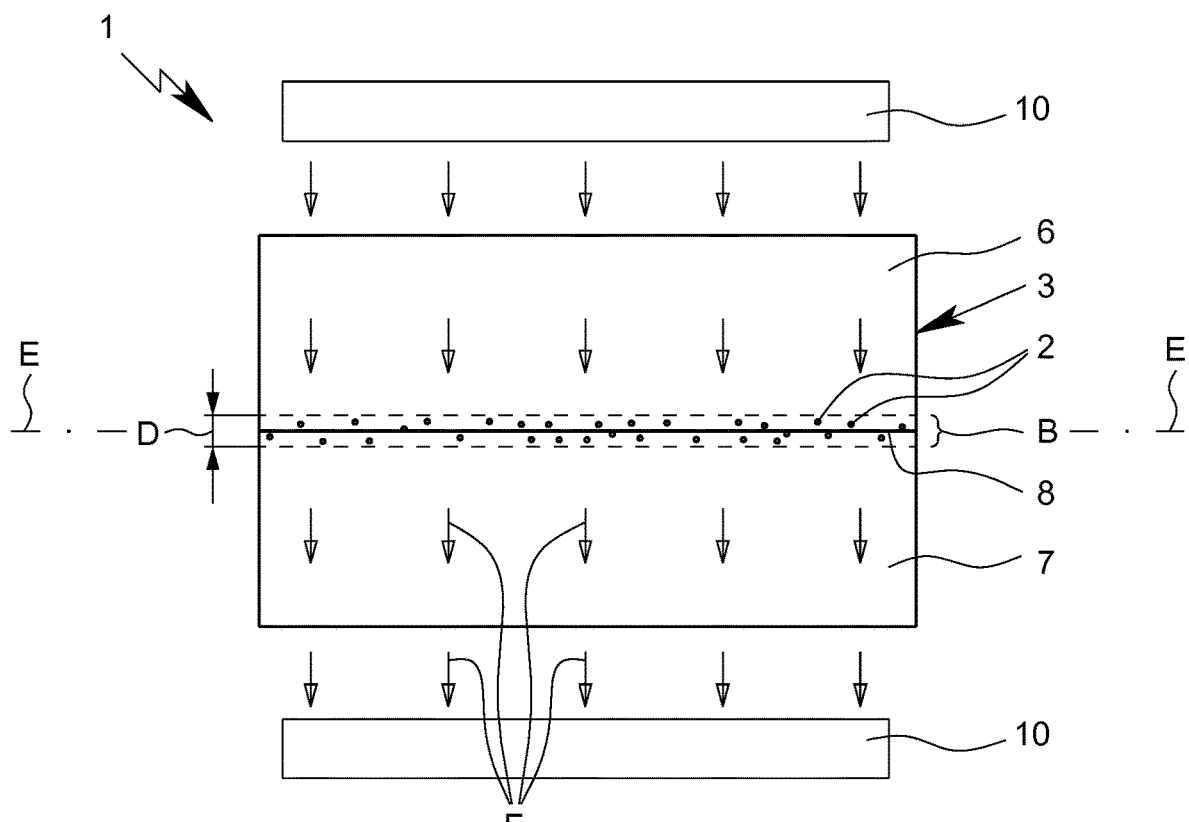
FIG. 2 shows a schematic side view of the device with field-generating means.
Figure 3:
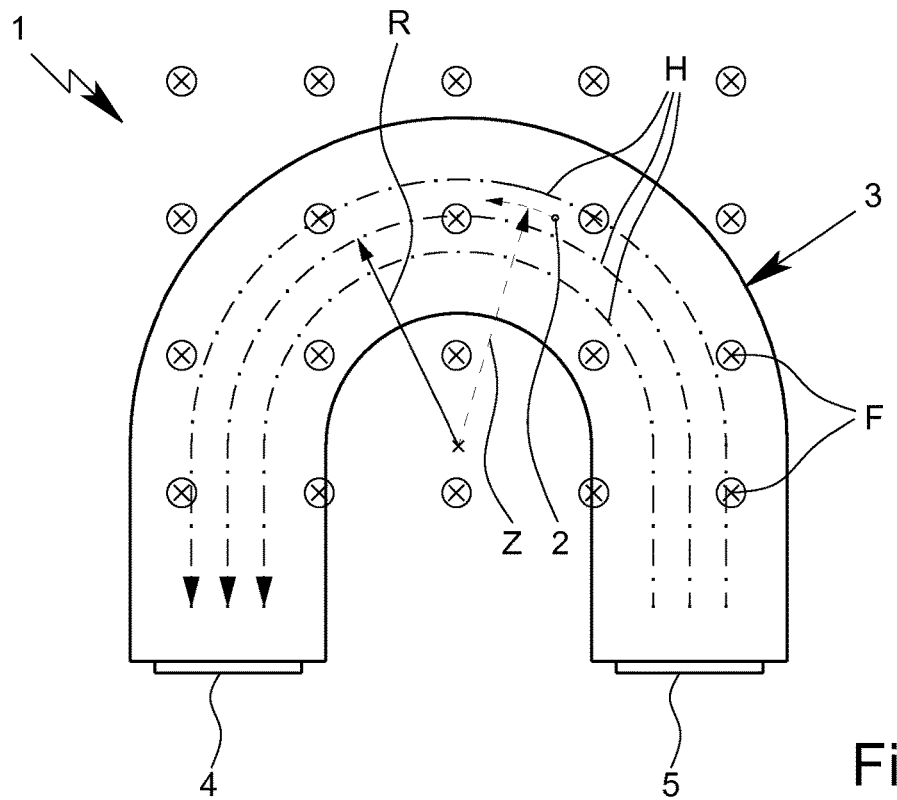
FIG. 3 shows a schematic top view of the device without field-generating means.

In a highly schematic, perspective view, FIG. 1 shows a proposed device 1 according to a first embodiment. FIG. 2 shows the device 1 in a schematic side view with associated field-generating means 10. FIG. 3 shows the device 1 in a schematic top view without the field-generating means 10.

The device 1 is used to guide carriers 2 (indicated schematically in FIG. 2), each of which has an electrical charge and/or a magnetic moment. The carriers 2 are particularly charge carriers, especially preferably electrons. However, they can also be so-called holes, i.e., electron holes.

The device 1 has a guide device 3 for movably guiding the carriers 2. The guide device 3 is particularly a solid body or solid structure. The carriers 2 can thus move particularly in a solid body or solid structure.

Preferably, the carriers 2 can move at least substantially only in one—particularly flat and/or laminar—movement region B, as indicated in FIG. 2.

The device 1 or guide device 3 is preferably provided with electrical connections 4 and 5, which are indicated in FIGS. 1 and 3.

In the depicted example, the device 1 or guide device 3 is preferably constructed from a first solid body or semiconductor 6 and a second solid body or semiconductor 7. These are arranged over one another in laminar fashion and/or have a common boundary surface 8.

The contact or boundary surface 8 of the two solid bodies or semiconductors 6, 7 or movement region B is preferably at least substantially flat and/or extends preferably at least substantially along a closed—particularly flat or spherical—surface and/or in a plane E, as indicated in FIG. 2.

The layers or solid bodies 6, 7, lying on top of each other, preferably form a two-dimensional electron gas for the carriers 2. In the terms of solid-state physics, the electron gas consists of freely movable carriers 2 in the form of electrons or holes in the conduction band, particularly with a large mean free path length of preferably greater than 100 nm, particularly greater than 200 nm. This especially conductive zone is preferably formed only on both sides of the boundary surface 8, i.e., in the form of a very thin layer that forms the movement space B for the carriers 2.

As mentioned previously, instead of electrons, these can be, for example, so-called holes i.e., electron holes, that can move as charge carriers at least largely freely and particularly with a large mean free path length in the movement region B.

The guide device 3 and/or the movement region B preferably forms a curved or angled main path H for the carriers 2, with several parallel main paths H being indicated schematically in FIG. 3.

The guide device 3 and/or the movement region B and/or the main path H is preferably curved in an arcuate manner, particularly in semicircular, parabolic or horseshoe-shaped fashion. Alternatively or in addition, however, the guide device 3 and/or the movement region B and/or the main path H can also be angled a single time or multiple times, particularly forming a V-shape or U-shape.

Preferably, the curved and/or angled guide device 3 and/or movement region B and/or main path H comprises only a single direction of curvature or a curvature of which the sign does not change or is conserved. An angled guide device 3 and/or movement region B and/or main path H is preferably also understood to be curved in this sense. Preferably, adjacent straight sections of an angled guide device 3, movement region B main path H are each branched off or angled in the same direction, in particular so as to form at least substantially a V-shape or U-shape.

Especially preferably, the guide device 3 and/or the movement region B and/or the main path H extends at least substantially in a surface or plane E, very especially preferably here the plane E of the boundary surface 8, and is curved and/or angled in this surface or plane E. This is conducive to very easy execution and manufacture, particularly in terms of the application of very thin layers having a defined thickness.

The connections 4 and 5 are preferably arranged and/or spaced apart from one another along the main path H, particularly in the area of the ends of the arch or angling of the guide device 3 or movement region B.

The movement region B is preferably layer-like and/or multilayered. The movement region B or the respective layer preferably has a mean thickness D of less than 500 nm, particularly less than 300 nm, especially preferably about 200 nm or less.

The mean width W of the movement region B and the radius of curvature R of the main path H corresponds or correspond at least substantially to the mean free path length of the carriers 2 in the movement region B or is or are preferably smaller. The mean free path length of the carriers 2 in the movement region B is preferably more than 25%, more preferably more than 50%, in particular more than 75%, most preferably more than 100%, of the length of the main path H or the distance between the connections 4, 5 along the main path H.

The (mean) radius of curvature R of the guide device 3 and/or of the movement region B and/or main path H is preferably greater than 100 nm, particularly greater than 200 nm, and/or less than 2000 nm, particularly less than 1600 nm.

The mean width W of the movement region B is preferably greater than 80 nm, particularly greater than 100 nm, and/or less than the (mean) radius of curvature R.

The boundary surfaces of the movement region B are preferably embodied such that the carriers 2 are reflected; in principle, this can occur specularly (i.e., the angle of reflection corresponds at least substantially to the angle of incidence) or nonspecularly, i.e., in a particularly diffusely scattering manner.

Especially preferably, the carriers 2 are reflected particularly on lateral flanks 9 of the movement region B. This preferably occurs in a diffusely scattering and/or at least partially non-specular manner and/or a manner in which the probability of reflection to a certain angle does not follow a sine or cosine function.

The device 1 preferably has the field-generating means 10. Alternatively, this field-generating means 10 or the field F generated by it can be only associated with the device 1 and/or act only on the device 1 or guide device 3 or movement region B.

The field-generating means 10 is used to generate or control a field F for guiding the carriers 2 at least substantially along the main path H, particularly so that a different probability density/presence density of the carriers 2 is or can be generated at the connections 4 and 5 and/or in the vicinity of the ends of the arcuate or angled main path H.

The field F is indicated schematically in FIGS. 2 and 3.

The field F is particularly a magnetic field. The field-generating means 10 is thus designed particularly to generate a magnetic field. As a matter of principle, permanent magnets can be used for this purpose. Alternatively, however, electromagnets can also be used, particularly in order to generate an electromagnetic field as a field F for guiding the carriers 2.

Preferably, the field-generating means 10 is embodied such that the field F for guiding the carriers 2 acts at least substantially only in the area of the curvature or bending of the movement region B and/or guide device 3 and/or deflects the carriers 2 onto curved paths at least substantially only in that area.

The field F for guiding the carriers 2 and/or the field-generating means 10 is or can be preferably set up or adapted or even controlled or regulated such that the carriers 2, starting from a mean speed—particularly as a function of the mean kinetic energy or thermal energy—are guided through the field F (particularly due to the Lorentz force with a gyroradius Z, as indicated schematically in FIG. 3) at least substantially along the curved or angled main path H and/or at least substantially with the mean radius of curvature R in the guide device 3 or in the movement region B. As mentioned previously, this applies particularly only to a direction of motion along the main path H and not in the opposite direction. This asymmetry is important with respect to the proposed non-uniform distribution of the carriers 2 in the movement region B or along the main path H.

The gyroradius Z effected by the field-generating means 10 and/or by the field F is preferably on the order of magnitude of the (mean) radius of curvature R of the guide device 3 or of the movement region B. Especially preferably, the gyroradius Z is smaller or greater than the radius of curvature R by no more than a factor of 5, especially preferably by no more than a factor of 2. In particular, the gyroradius Z corresponds at least substantially to the radius of curvature R.

Due to the different probabilities of presence of the carriers 2 in the area of the ends of the angled or curved main path H, an electrical voltage, particularly also an electric current and hence also electrical power, can be emitted or tapped via the connections 4 and 5 arranged particularly in these areas.

In the depicted example, the connections 4 and 5 are arranged particularly on the two front sides or ends of the movement region B and/or main path H and/or the guide device 3.

As required, several guide devices 3 or movement regions B can also be arranged with their flat sides on top of one another. These are then preferably penetrated by the same field F. In particular, these can be optionally connected in parallel or serially, particularly to the connections 4 and 5 or other connections.

The proposed device 1 can be used particularly to generate an electrical voltage or power from the thermal or heat energy of charge carriers 2 and/or from the electromagnetic inherent or ambient noise and/or from electromagnetic influence or radiation by tapping the voltage or power via the connections 4 and 5. The field F is preferably maintained at least substantially constant. Alternatively, however, the field F can also be controlled or regulated in order to achieve or exceed a defined value or reach a maximum in the tapped current or power.

Alternatively or in addition, the proposed device 1 can also be used for cooling through the removal of thermal or heat energy from the carriers 2 by tapping electrical power via the connections 4 and 5. It is thus also possible to cool the device 1 itself. This can also be conducive to taking power, which constitutes a selfreinforcing effect.

During cooling, the field F is preferably maintained at least substantially constant. Alternatively, however, the field F can also be controlled or regulated in order to achieve or exceed a defined value or reach a maximum in the tapped voltage or power.

Furthermore, it is possible to use the proposed device 1 for measuring or determining scattering or trajectories of charge carriers 2 by measuring the electrical voltage via the connections 4 and 5. In particular, the acting field F can be varied, thereby inferring corresponding scattering or trajectories of charge carriers 2 by identifying maxima in the measured electrical voltage, for example.

In general, the proposed principle can also be used to measure or determine physical characteristics within a one- or two-dimensional electron gas or superconductor if the movement region B is formed in or by such a one- or two-dimensional electron gas or superconductor. Accordingly, the voltage present at corresponding connections 4 and 5 provides information about the physical characteristics, particularly as a function of the acting field F or magnetic field.

The proposed principle can also be used to measure or identify magnetic field strengths or other fields F acting on the guide device 3 by measuring the electrical voltage via the connections 4 and 5. Namely, this depends on the acting field F, as will be explained in further detail later on in relation to the third embodiment and the related diagram. In particular, with proper calibration, the acting magnetic field strength of the field F can be determined from the measured electrical voltage.

Additional embodiments of the proposed device 1 of the present invention are explained in further detail with reference to the other figures. The preceding remarks, aspects, and features apply particularly in analogous or supplementary fashion even if a repeated description is omitted.

Figure 4:
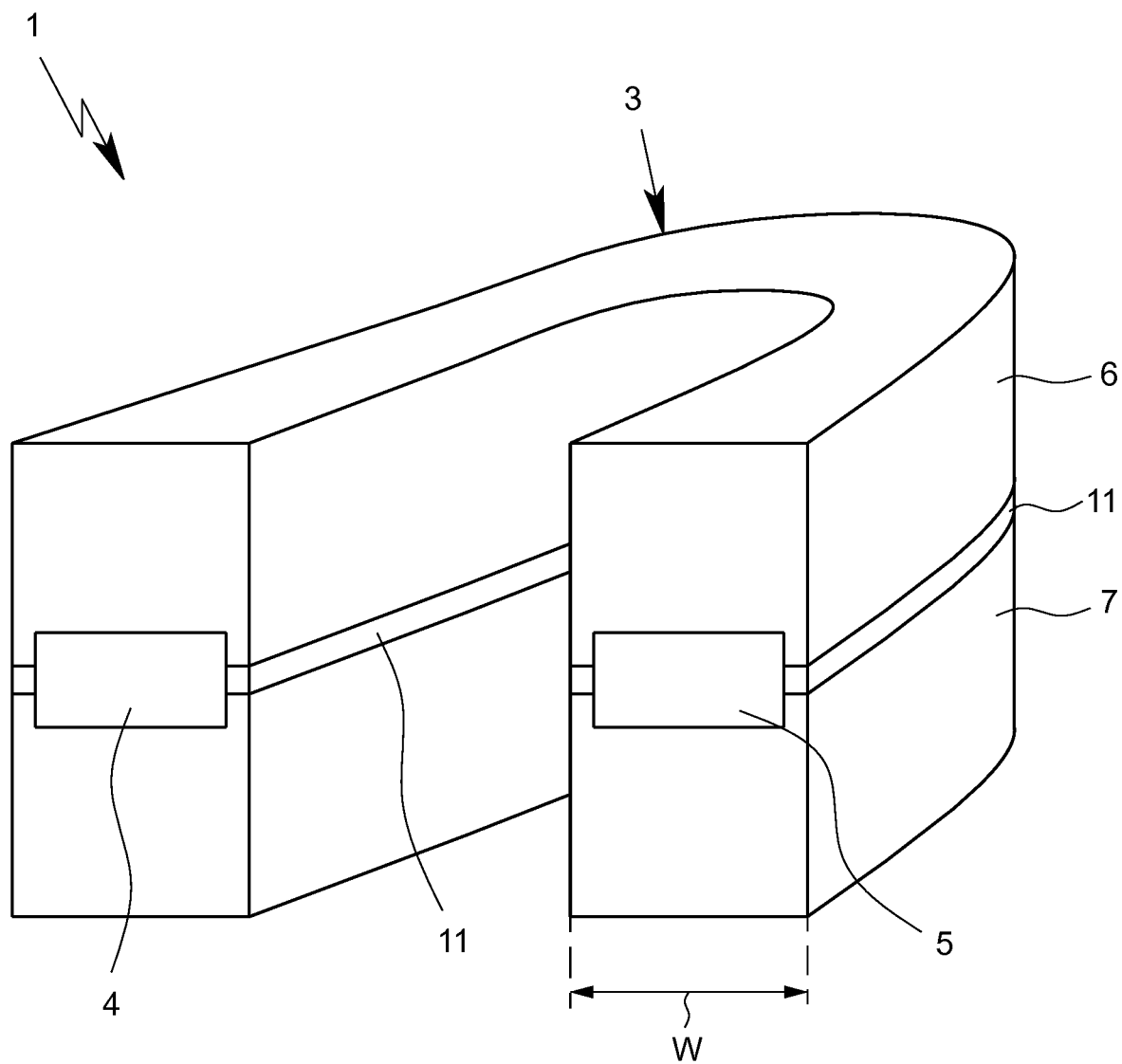
FIG. 4 shows a perspective view of a proposed device according to a second embodiment.

In a schematic view corresponding to FIG. 1, FIG. 4 shows a proposed device 1 according to a second embodiment.

The second embodiment differs from the first embodiment only in that, instead of an electron gas, a thin superconducting layer 11 is preferably used to form the movement region B. The superconducting layer 11 is preferably formed or arranged by or on the solid body 6 or 7 and/or particularly between the two, as is indicated in FIG. 4.

The dimensioning of the layer 11 or of the movement region B formed by it preferably corresponds to the movement region B described in relation to the first embodiment and the dimensioning thereof, so that reference is made thereto.

The carriers 2 are particularly present in the superconducting layer 11 as electrons or holes, i.e., electron holes.

A superconducting material of so-called type II is particularly used for the layer 11, so that, in the case of higher magnetic fields, magnetic field lines in the form of so-called flux lines or vortices penetrate into the material, with so-called hard superconducting materials being preferably used in which the flux lines are held up to a defined threshold force that is as high as possible so that they have a high flux-flow resistance.

Figure 5:
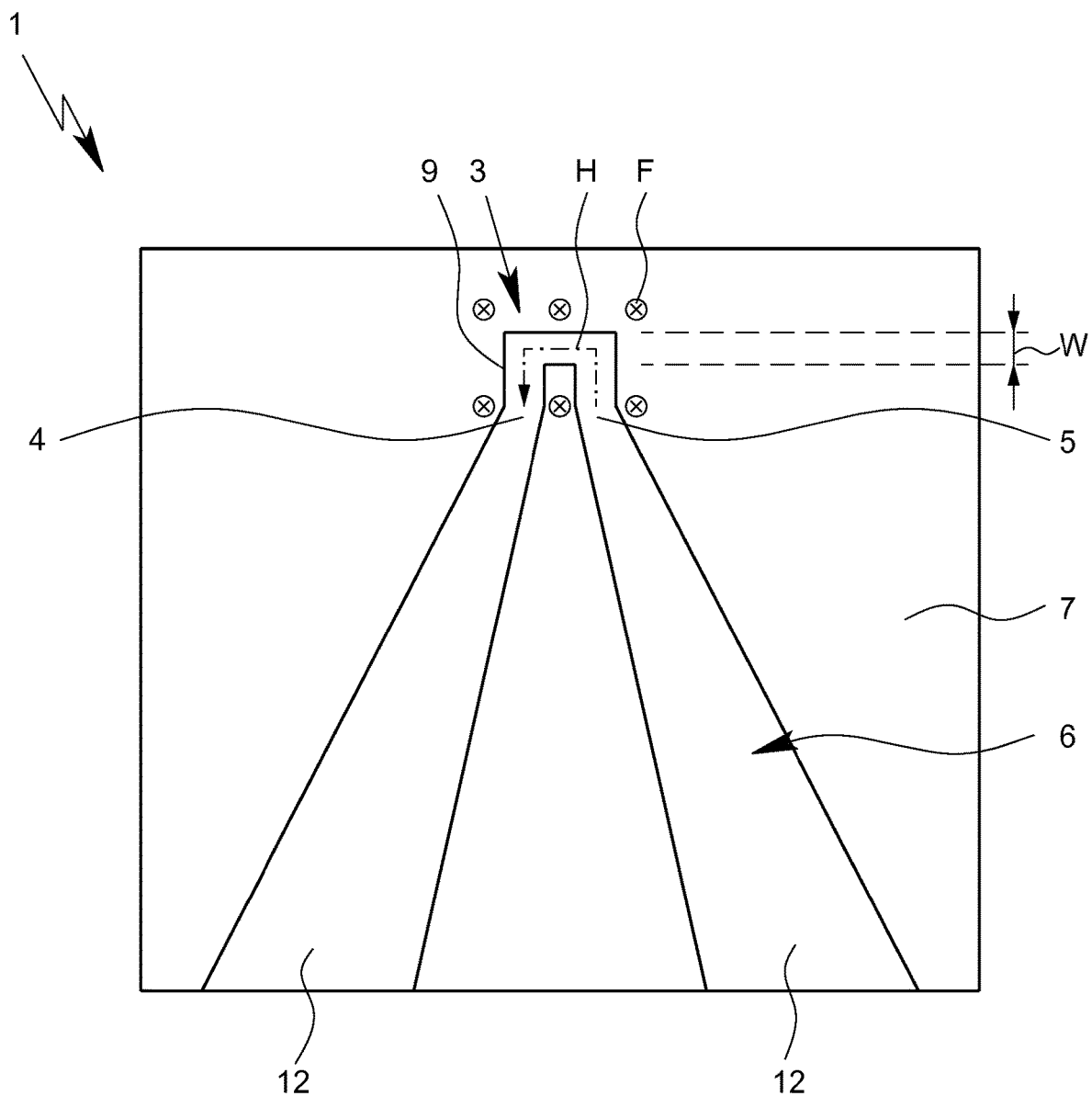
FIG. 5 shows a schematic top view of a proposed device according to a third embodiment.

In a schematic top view, FIG. 5 shows a proposed device 1 according to a third embodiment. This is a schematic representation of an implemented experimental setup.

A layer 6 is applied to a lower layer or a lower substrate or solid body 7 the layer 6 particularly forming a layer system or layer package or is constructed as such.

Especially preferably, the layer 6 or layer system is constructed according to the experimental setup as follows:

A layer-system of differently doped semiconductor materials (such as InGaAs versus GaAs or AlGaAs versus GaAs or InGaAs versus InP etc.) which in particular exhibit long mean free path lengths for electrons, are layered over one another. Thus, preferably, a layer of a first semiconductor material, particularly GaAs or InP, and a layer of a second semiconductor material, particularly $Al_{0.33}Ga_{0.67}As$ or InGaAs, are layered over one another. The term InGaAs refers to an alloy containing Indium (In), Gallium (Ga) and Arsenic (As). The use of the term InGaAs does not imply that In, Ga and As are present in the alloy with equal contents. In particular, these layers are layered multiply over one another in an alternating manner, preferably more than 10 or 20 times, particularly between 20 and 100 times, and in the experimental setup especially preferably 50 times. A layer package is thus formed.

The thickness D of the individual layers is preferably less than 50 nm, particularly less than 25 nm, especially preferably less than 10 nm, and most preferably about 5 nm.

The layer package is optional and is preferably arranged on a base layer or intermediate layer, particularly of GaAs or InP and/or with a thickness of greater than 100 nm, especially preferably greater than 250 nm, most preferably with a thickness of about 500 nm.

A covering layer or first layer of preferably greater than 500 nm, particularly greater than 750 nm, especially preferably about 1000 nm, and/or preferably of GaAs or InP is preferably applied to the layer package or another substrate.

In turn, another or second layer of $Al_{0.33}Ga_{0.67}As$ or InGaAs with a thickness of about 10 to 50 nm, especially preferably about 35 nm, is preferably applied to this GaAs layer. Preferably, yet another layer or first covering layer, particularly of $Al_{0.33}Ga_{0.67}As$ or InGaAs, particularly with silicon doping of preferably $1.5 \cdot 10^{18}$ cm$^{-3}$ and/or with a thickness of preferably greater than 25 nm, particularly about 45 nm, is applied over that.

Subsequently, another layer or covering layer can be applied, particularly of GaAs or InP, especially preferably with a thickness of greater than 10 nm, and about 15 nm in the experimental setup.

The two-dimensional electron gas and laminar movement region B is preferably formed in the boundary region between the first layer or 1000 nm layer, here of GaAs or InP, and the second layer or 35 nm layer, here of undoped $Al_{0.33}Ga_{0.67}As$ or InGaAs.

The aforementioned layer system is especially preferably applied to the lower layer system or the lower solid body 7. In the experimental setup, this layer or solid body 7 especially preferably consists of a semiconducting GaAs substrate.

That is, the following layer system was especially preferably used in the experimental setup:

| Name/designation | Preferred composition | Preferred thickness |
|---|---|---|
| Additional covering layer | GaAs | 15 nm |
| First covering layer | $Al_{0.33}Ga_{0.67}As$: Si $1.5 \cdot 10^{18}$ cm$^{-3}$ | 45 nm |
| Second layer | $Al_{0.33}Ga_{0.67}As$ | 35 nm |
| First layer | GaAs | 1000 nm |
| Multiply superimposed thin layers | GaAs $Al_{0.33}Ga_{0.67}As$ | 5 nm 5 nm |
| Intermediate layer | GaAs | 500 nm |
| Lower layer/substrate | S—I GaAs | >500 nm |

The layer 6 or layer system thus forms a two-dimensional electron gas and hence a movement region in the abovementioned sense, as described in connection with the first embodiment. Reference is therefore made to the remarks and explanations regarding the first embodiment, which apply analogously or additionally.

In the illustration according to FIG. 5, the surface or plane E of the movement region B or the boundary surface 8 lies within the layer system 6 in the drawing plane or parallel thereto.

In the third embodiment, the guide device 3 and/or layer 6 and/or the layer system preferably form two tapering and/or converging legs 12, which form or lead to the connections 4 and 5.

In particular, the layer 6 or the layer system forms the guide device 3 in the form of a singly or multiply, particularly doubly, angled profile. In particular, a substantially U-shaped profile is formed in the top view or in the plane of the movement region B or for the main path H, as indicated in FIG. 5.

The movement region B or the guide device 3 is particularly limited to the upper U-shaped region of the layer 6 or the region indicated by the main path H in FIG. 5.

The mean width W of the angled or U-shaped profile or of the movement region B is preferably greater than 200 nm, particularly greater than 500 nm, and/or less than 9000 nm, particularly less than 7000 nm.

In the experimental setup, a mean width W of about 600 to 650 nm was obtained. In the experimental setup, the interspace in the region of the two connections 4 and 5 was also preferably as much as the mean width W or less.

The proposed setup or arrangement can be produced in a relatively simple manner particularly by photolithographic means or through appropriate etching or, alternatively, through laser processing or laser ablation.

Preferably, different semiconductor materials are used for the layer system.

In the experimental setup, the abovementioned semiconductor materials in particular were used for the layer system 6 and/or mean free path lengths around 600 nm were achieved.

The field F or magnetic field preferably extends at least substantially perpendicular to the drawing plane or plane E (not drawn in), as indicated in FIG. 5.

Figure 6:
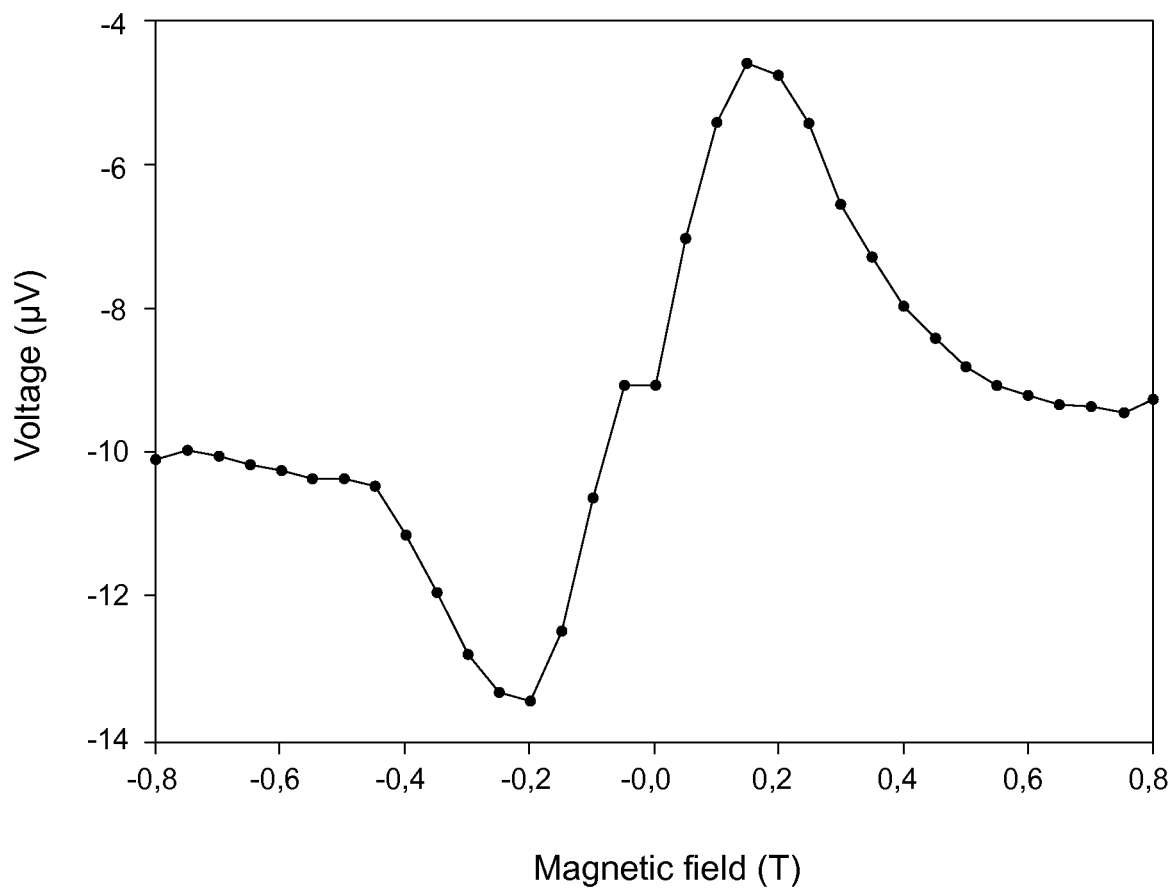
FIG. 6 shows a voltage diagram measured on the device according to the third embodiment.
Figure 7:
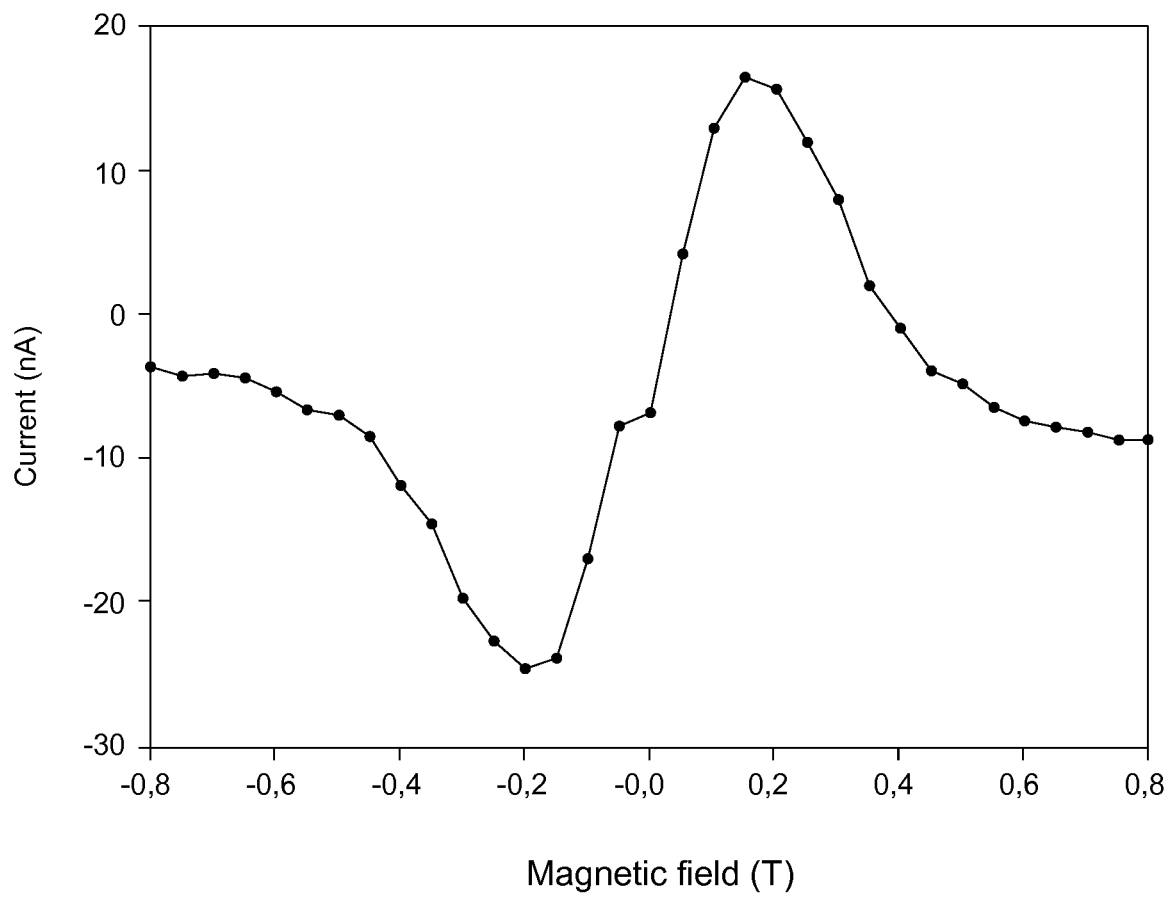
FIG. 7 shows a current diagram measured on the device according to the third embodiment.

In the proposed experimental setup, the voltage on the one hand and the current on the other hand were measured via the legs 12 or connections 4 and 5 as a function of the magnetic field applied or the resulting magnetic flux density. FIGS. 6 and 7 show the resulting diagrams and curves.

It can clearly be seen from FIGS. 6 and 7 that an extreme value, more particularly a minimum and maximum, is obtained for the voltage and current, respectively, at about ±0.2 T. This is commensurate with theoretical calculations for the mean radius of curvature R of about 600 nm implemented here. The measurements were performed at temperatures below 20 K.

The resulting diagrams and measurement curves are—as expected—symmetrical to the zero point of the magnetic field (more precisely of the magnetic flux density) and can be explained by the fact that, given the magnetic flux density of about 0.2 T under the stated test conditions, the charge carriers are guided at least substantially along the main path H, that is, within the desired movement region B and/or guide device 3, namely in dependence on the direction of the magnetic field once in one direction and once in the other direction, so that opposite polarities are obtained at about +0.2 T and −0.2 T for the voltage and the current, respectively.

Alternatively or in addition, the offset that can be seen as original measurement data in the diagrams according to FIGS. 6 and 7 can be explained by electrostatic or Peltier effect-related interference, which is, however, independent from (invariant to) the magnetic field.

Figure 8:
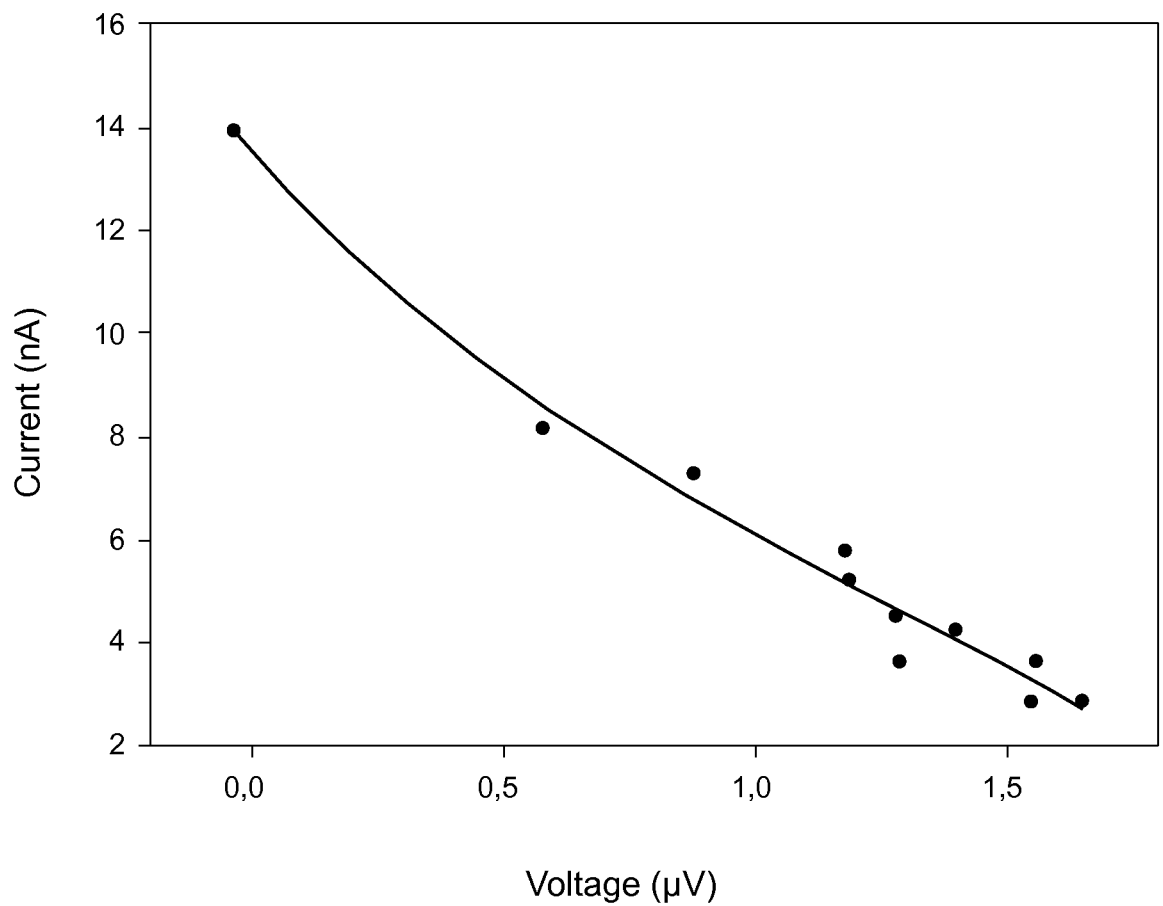
FIG. 8 shows a diagram of a measured current/voltage characteristic, i.e., a diagram of the tappable electrical power.

FIG. 8 shows a current/voltage characteristic measured using the described experimental setup or device 1 tapped externally. This characteristic shows that electrical power can be generated and/or be emitted and/or tapped from the proposed device 1.

Accordingly, an electrical voltage or electrical power can thus be tapped by means of the proposed experimental setup or device 1 and generated or made available from the thermal energy of the charge carriers 2 or the device 1 or the guide device 3 and/or from the electromagnetic inherent or ambient noise or from electromagnetic influence or radiation. In other words, it is thus possible to use the device 1 for the provision of electrical energy or power by means of an electrical tap via the connections 4 and 5.

Alternatively or in addition, it is also possible to use the device 1 for cooling. To wit, if electrical power is tapped via the connections 4, 5, thermal energy is drawn from the charge carriers 2 or the device 1 or guide device 3, whereby a cooling effect or temperature reduction can be achieved.

Especially preferably, the field-generating means 10 or the field F for guiding the carriers 2 can be controlled or regulated in order to reach or exceed a defined or desired level of tapped electrical voltage or power or in order to reach a maximum of the tapped electrical voltage or power.

As mentioned previously, the proposed device 1 or the proposed principle is universally applicable.

In particular, the voltage tapped via the connections 4, 5 can also be used to measure or determine other characteristics, particularly the measurement or determination of scattering or trajectories of charge carriers 2 with appropriate calibration or appropriate variation of the respective conditions, such as the field F.

Furthermore, it is also possible to measure or determine physical characteristics of the guide device 3 and/or of the movement region B and/or of the carriers 2 movable therein through the measurement and analysis of the electrical voltage tapped via the connections 4, 5. This is especially the case if a one- or two-dimensional electron gas or a superconductor is used as a guide device 3 or for the movement region B or as a (conductive) layer 11.

Moreover, the proposed device 1—without, however, the field-generating means 10—can also be used to measure magnetic field strengths or magnetic flux densities acting on the guide device 3 by measuring the electrical voltage via the connections 4 and 5. Then, with appropriate calibration, the acting magnetic flux density is accordingly very easy to determine and/or identify. The device 1 (without field-generating means 10) can then be regarded and used particularly as a magnetic sensor.

Alternatively or in addition, the proposed device 1 can also be used or employed to detect or measure electromagnetic inherent or ambient noise (of the carriers 2) and/or an electromagnetic influence or radiation.

Figure 9:
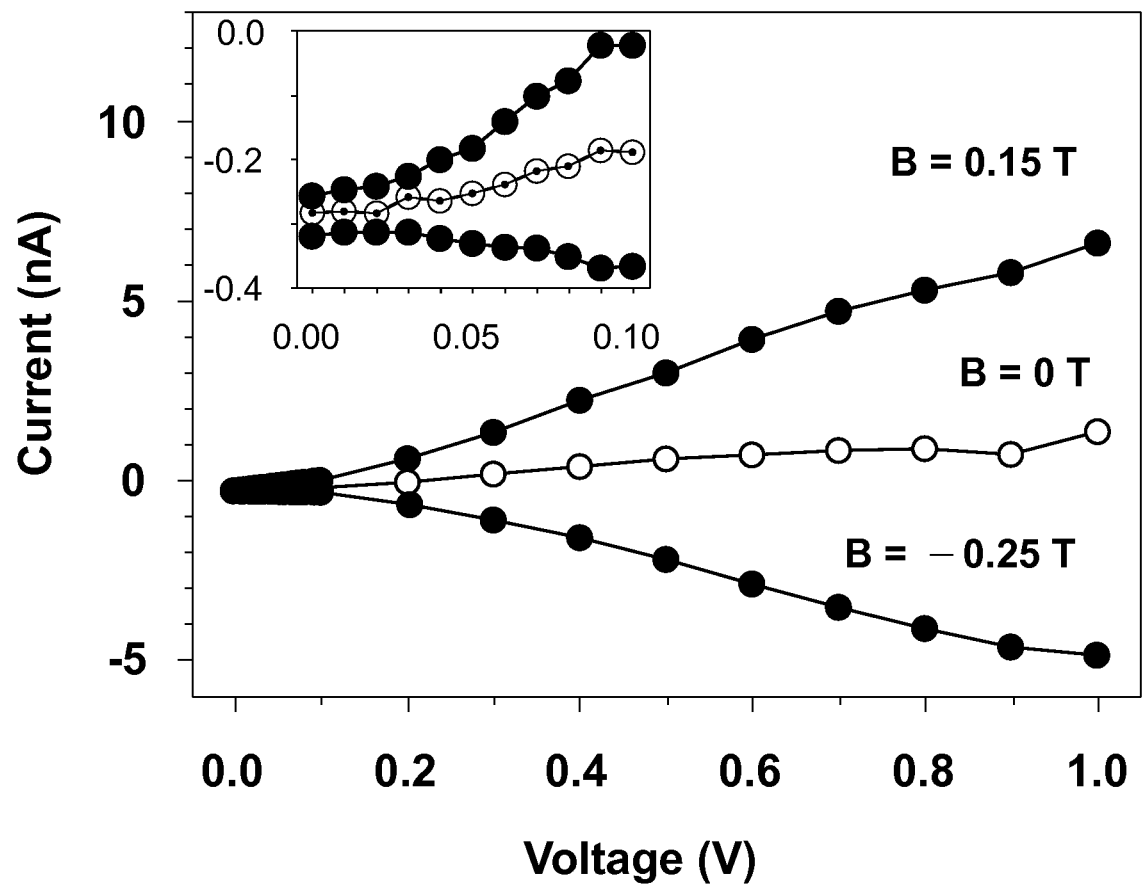
FIG. 9 shows a diagram of various current characteristics.

FIG. 9 shows the result of current measurements that were carried out on an experimental setup in terms of the invention and tapped or measured via the connections 4 and 5. It demonstrates how robust the effect of unequal conductivity is in the two directions that are dependent on the orientation of the magnetic field. In this experiment, an additional alternating current voltage coming from the outside was applied to the setup in order to provide excitation in the MHz range, and this applied voltage was varied over a wide range from 0 to about 1 V.

The measurement was performed at about 10 K.

With a measurement series B=0 T, the neutral curve was defined which shows the current without an external magnetic field but under inclusion of all other possible sources of interference (such as currents as a result of electrochemical contacts or thermoelectric voltages). The measurement series with the magnetic field B=+0.15 T shows that the preference for conductivity in the positive current direction remains positive over all excitation frequencies and the resulting current is approximately proportional to the alternating current voltage applied. The measurement series with the magnetic field B=−0.25 T shows, in addition, that the preference for conductivity in the negative current direction remains negative over all excitation frequencies and the resulting current is also approximately proportional to the alternating current voltage applied. In particular, however, it should be emphasized that even in the complete absence of an external excitation (i.e., where V=0), a positive (B=+0.15 T) or negative (B=−0.25 T) current flows in departure from the case without a magnetic field (see insert or enlargement in FIG. 9). This is proof that continuous electrical output can be tapped externally from the setup or device 1 according to the invention that does not originate from the influence of other possible sources of interference (such as currents resulting from electrochemical contacts or thermoelectric voltages), but rather only from the thermal energy of the electrons or the inherent or ambient noise.

Figure 10:
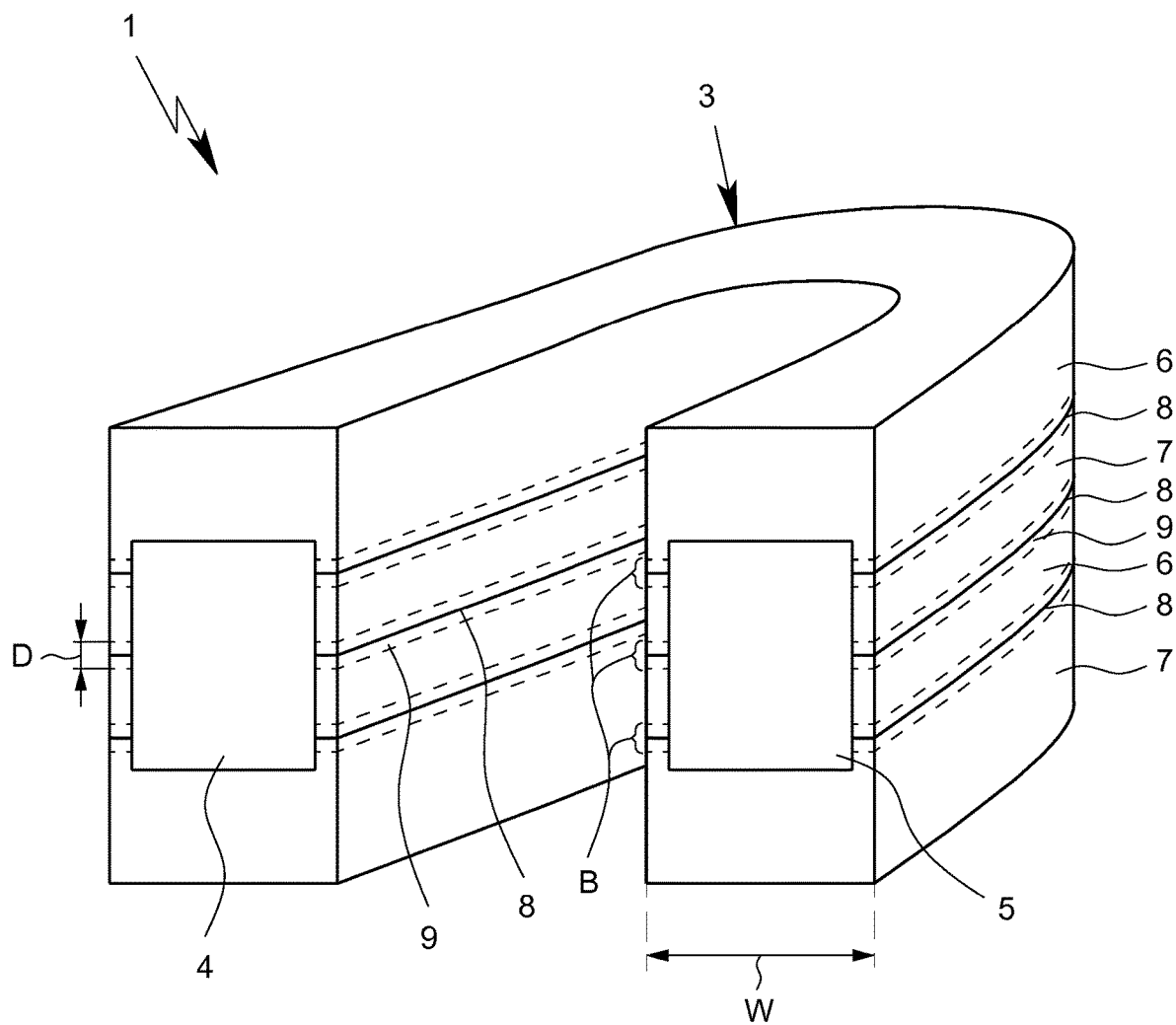
FIG. 10 shows a perspective view of a proposed device according to a fifth embodiment in a representation corresponding to FIG. 1.

In a schematic representation corresponding to FIG. 1, FIG. 10 shows a fifth embodiment of the proposed device 1 with several movement regions B or electron gases that are particularly layered with their flat sides on top of one another.

The several movement regions B are preferably formed in or by a common guide device 3.

The several movement regions B are preferably connected in parallel and/or connected via common electrodes 4, 5.

Different intermediate or depletion layers can be arranged or formed between the various movement regions B or electron gases as needed.

The foregoing remarks apply particularly in an analogous or supplementary manner to the fifth embodiment just as they do to the previous embodiments, for which reason repetitions in this regard will be omitted.

In the following, further exemplary embodiments will be described in particular with reference to FIGS. 11 to 22. The preceding remarks, aspects, and features apply particularly in analogous or supplementary fashion even if a repeated description is omitted. In addition, the following remarks, aspects, and features also apply to the previously presented embodiments in analogous or supplementary fashion.

Figure 11:
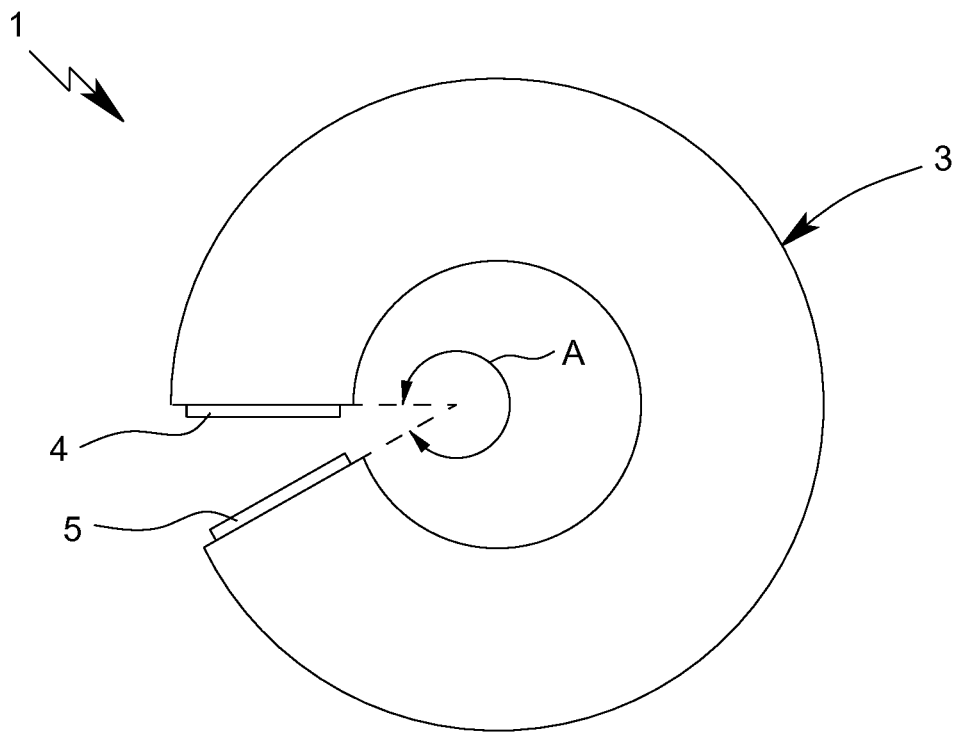
FIG. 11 shows a schematic top view of a proposed device according to a sixth embodiment.
Figure 12:
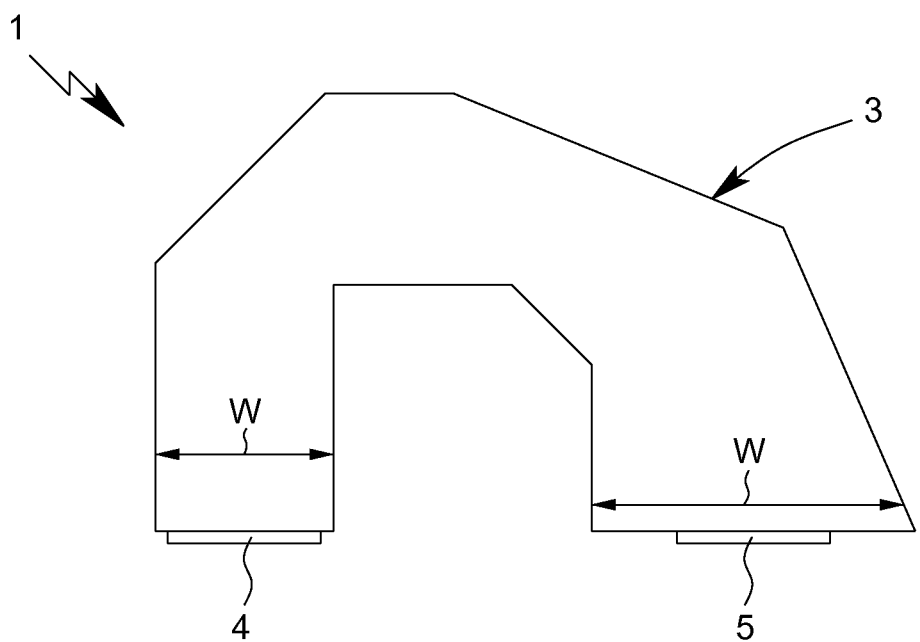
FIG. 12 shows a schematic top view of a proposed device according to a seventh embodiment.

FIGS. 11 and 12 show highly schematic top views of a sixth and seventh embodiment, respectively, of the guide device 3.

According to a sixth embodiment of the device 1, the guide device 3 and/or main path H can have the shape of a circular arc, as shown in FIG. 11.

Preferably, the guide device 3 and/or main path H runs through a circular sector with a central angle A of at least 15°, more preferably of at least 90°, in particular of at least 180°, particularly preferably of at least 270°, most preferably of at least 340°. However, arbitrary central angles A smaller or larger than 180° are possible.

The guide device 3 and/or main path H preferably forms a nearly closed path or loop.

As an alternative or in addition to a bended or curved main path H and/or guide device 3, other shapes are possible, in particular angled or polygonal shapes, in particular for the guide device 3 or main path H and/or for the inner and/or outer side walls limiting the movement region B. For example, the main path H and/or guide device 3, in particular its side wall(s), can have three straight strip-like sections, wherein two adjacent are arranged rectangular to one another in each case, so that the main path H and/or guide device 3 resembles the shape of an U.

FIG. 12 shows a seventh embodiment of the device 1 with another angled shape. Here, the shape of the guide device 3 and/or main path H roughly resembles a bow and/or the guide device 3 comprises several slanted edges or sides, that is, the angles between adjacent edges or sides are not necessarily 90°.

Furthermore, the (mean) width W of the movement region B can be different in different regions or sections of the guide device 3, as indicated in FIG. 12.

Figure 13:
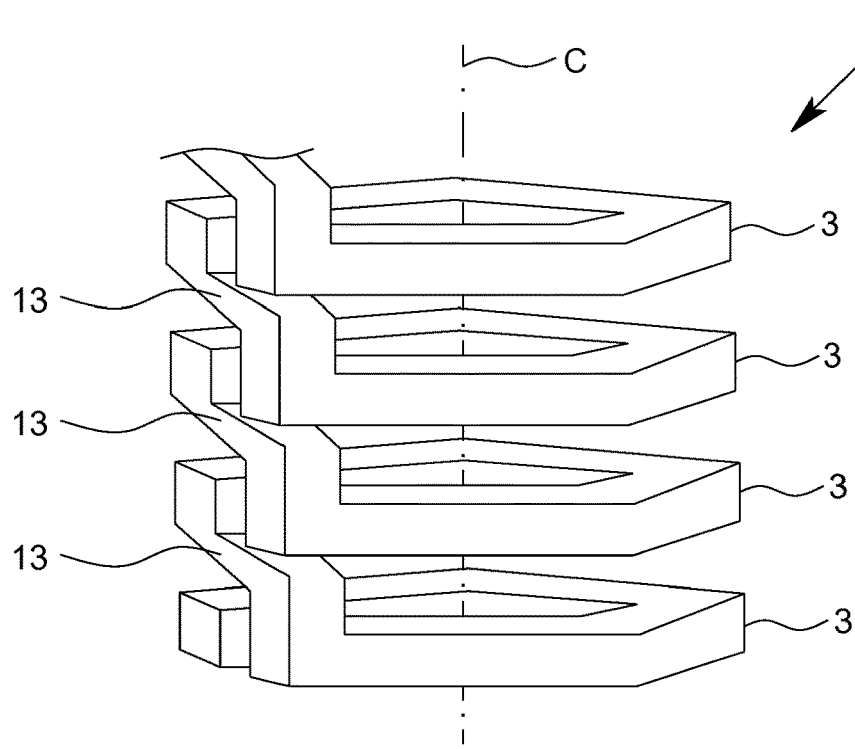
FIG. 13 shows a schematic perspective view of a proposed device according to an eighth embodiment.
Figure 14:
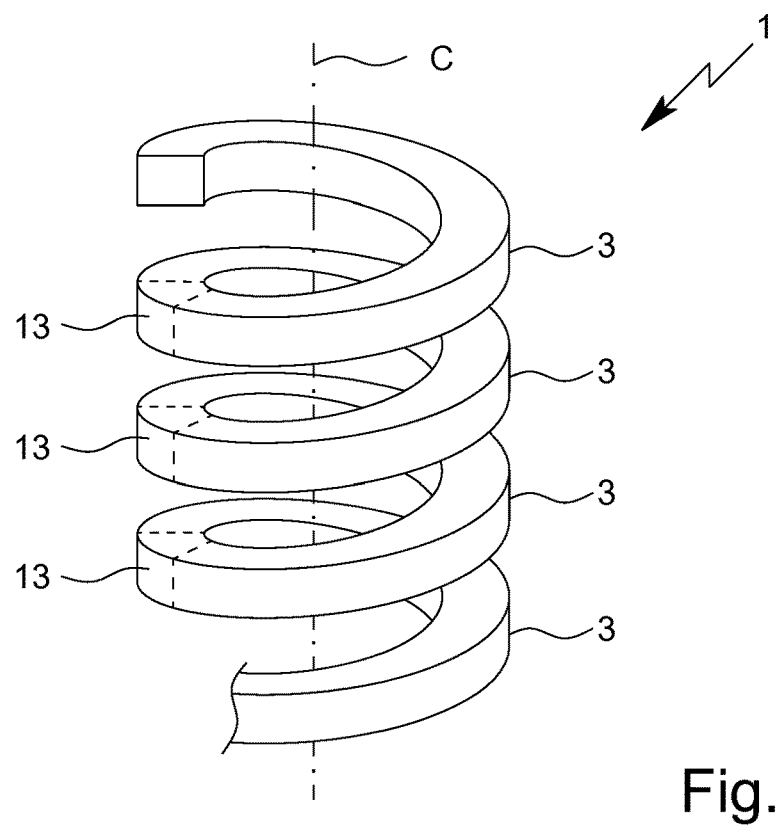
FIG. 14 shows a schematic perspective view of a proposed device according to a ninth embodiment.

FIGS. 13 and 14 schematically show an eighth and a ninth embodiment, respectively, of the device 1, wherein the device 1 comprises several guide devices 3.

The several guide devices 3, in particular of the eighth and ninth embodiment, are preferably serially connected.

As an alternative to several guide devices 3, the device 1 can comprise only one guide device 3 with multiple windings and/or loops.

The device 1 with several guide devices 3 preferably forms a three-dimensional structure.

Preferably, the several guide devices 3 of the device 1 are at least essentially identical and/or are formed by quasi-round or ideally round elements.

The several guide devices 3 and/or main paths H preferably each form a loop or run through a circular sector with a central angle A of at least 15°, more preferably of at least 90°, in particular of at least 180°, particularly preferably of at least 270°, most preferably of at least 340°, and/or form or comprise nearly closed main paths H, as explained above with reference to the sixth embodiment shown in FIG. 11.

Preferably, the several guide devices 3 are arranged on top of one another, in particular along a central or common axis C.

Particularly, several guide devices 3 and/or main paths H are arranged in such a manner that the several main paths H have art least substantially identical projections in a plane perpendicular to the common axis C.

The axis C preferably runs parallel or corresponds to the direction of the (magnetic) field F.

The movement regions B and/or main paths H of the several guide devices 3 are preferably at least essentially parallel and/or arranged in different planes.

In particular, the several guide devices 3 are connected serially and/or by vertical or diagonal connection elements 13.

The device 1 with several guide devices 3 and connection elements 13 is preferably designed as one continuous element winding around the central or common axis C.

As an alternative or in addition, the several guide devices 3, in particular together with the connection elements 13, are arranged screw-like or helix-like and/or form a corkscrew way as in particular shown in FIG. 14. In this case, the guide devices 3 and connection elements 13 of the device 1 preferably form one continuous element, in particular in the form of a screw or helix and/or are seamlessly connected to one another.

As a further alternative or in addition, the several guide devices 3, in particular together with the connection elements 13, are arranged in the form of a spiral which in particular spirals in a (two-dimensional) plane. In this case, the guide devices 3 and connection elements 13 of the device 1 preferably form one continuous element, in particular in the form of a spiral and/or are seamlessly connected to one another.

Preferably, the device 1 comprises a multitude of guide devices 3 which are in particular connected to one another, preferably more than $10^3$ guide devices 3, more preferably more than $10^5$ guide devices 3, most preferably more than $10^6$ guide devices 3.

In particular, more than $10^2$ guide devices 3, preferably more than $10^3$ guide devices 3, more preferably more than $10^4$ guide devices 3, of the device 1 are serially connected, and/or more than $10^2$ guide devices 3, preferably more than $10^3$ guide devices 3, more preferably more than $10^4$ guide devices 3, of the device 1 are serially connected in parallel.

Figure 15:
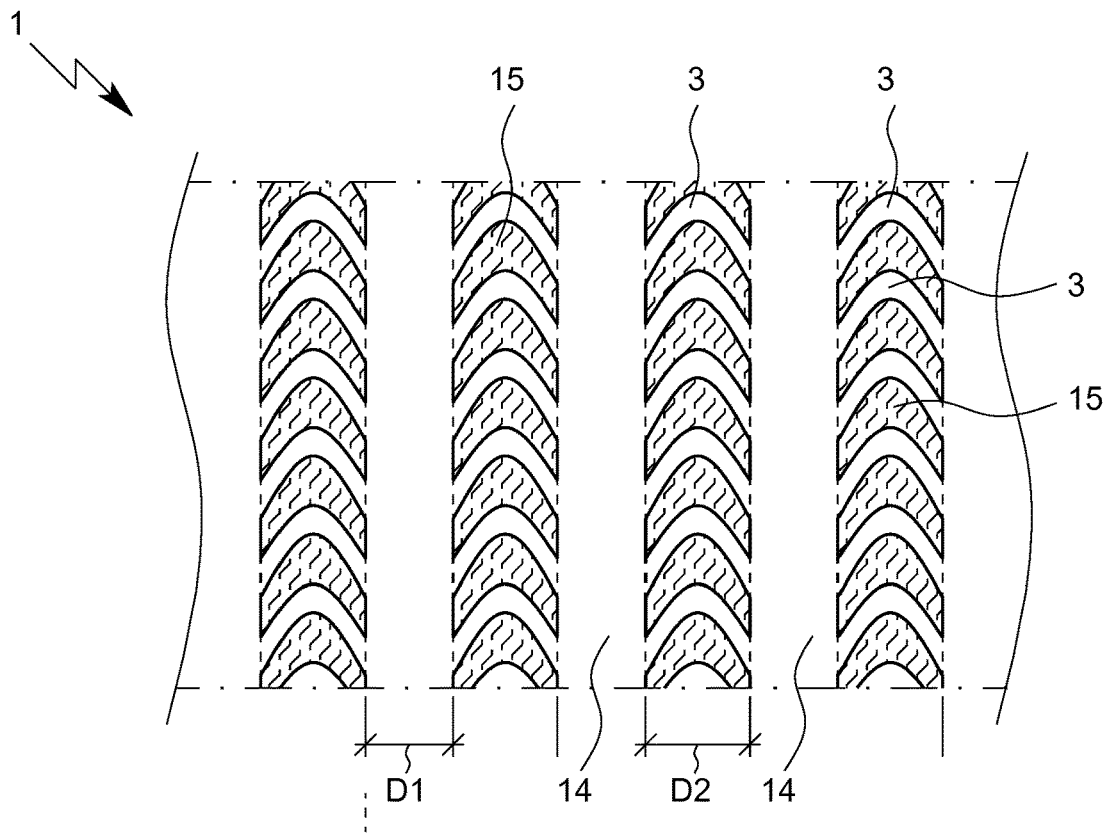
FIG. 15 shows a schematic top view of a proposed device according to a tenth embodiment.
Figure 16:
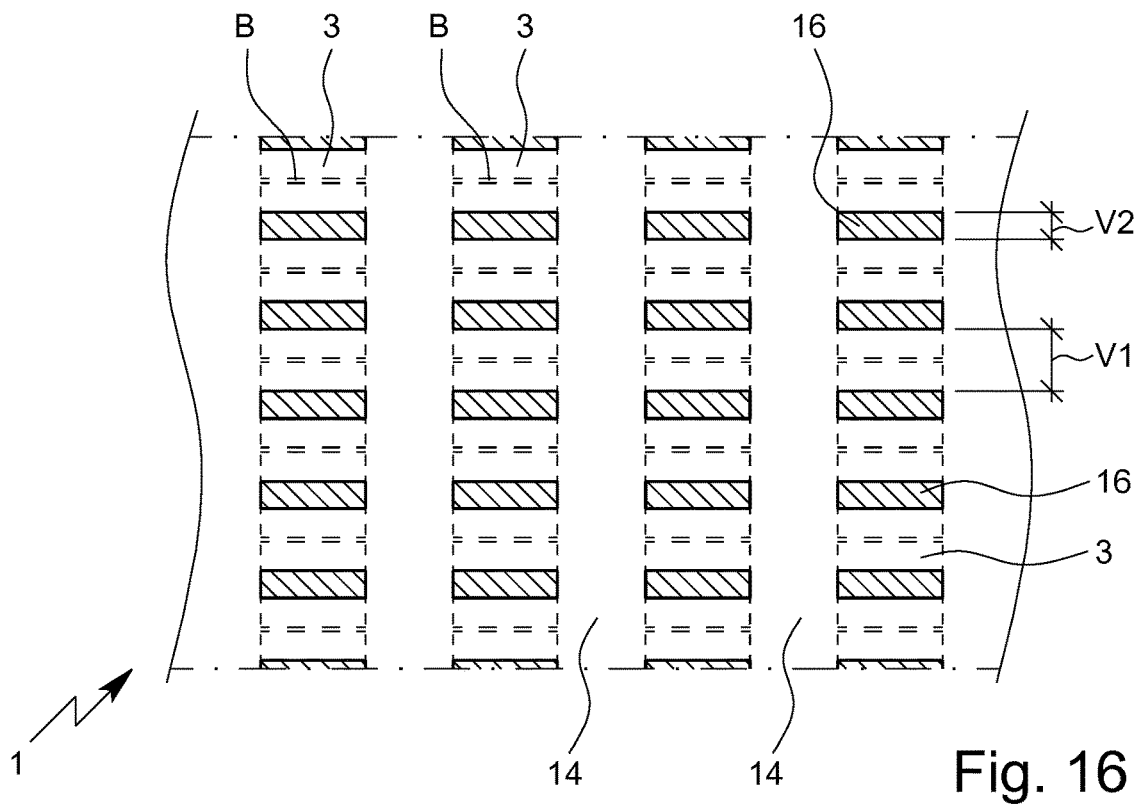
FIG. 16 shows a schematic side view of a proposed device according to the tenth embodiment.

FIGS. 15 and 16 schematically display different views of a tenth embodiment of the device 1, showing various possibilities of (electrically) connecting a plurality of guide devices 3, movement regions B and/or main paths H.

As mentioned before, several guide devices 3 can be connected in parallel and/or serially, in particular to form the device 1. FIGS. 15 and 16 show an arrangement in which a plurality of guide devices 3 are connected both in parallel and serially. However, these examples are not intended to be limiting and could be realized in a similar fashion by connecting the guide devices 3 only in parallel or only serially.

FIG. 15 shows a device 1 in which the guide devices 3 are arranged in a two-dimensional fashion and/or in one common plane.

In FIG. 16, a plurality of layers comprising a multitude of guide devices 3 which are connected serially and/or in parallel are arranged on top of one another.

Preferably, the guide devices 3 are connected to each other by electrodes or connecting devices 14. In particular, the electrodes or connecting devices 14 are connected to and/or form the connections 4, 5.

The connecting devices 14 can be designed at least essentially two-dimensional, flat, strip-like, rectangular and/or laminar. As an alternative, the connecting devices 14 can be designed three-dimensional, block-like and/or cuboid, as suggested in particular in FIG. 16.

The connecting devices 14 are preferably made of or comprise an electrically conducting and/or semiconducting material, in particular one or more of the materials of the layers or solid bodies 6, 7. However, other materials are possible here, too.

Guide devices 3 which are arranged in a common plane and/or connected in parallel are preferably arranged as a row between two preferably strip-like, in particular rectangular, connecting devices 14, in particular wherein the guide devices 3 of a row are separated by intermediate regions 15. The intermediate regions 15 are preferably formed by or comprise insulating and/or semiconducting material, for example air or an insulating solid.

As indicated in FIG. 15, the guide device (3) can have the form of a parabolic arc.

In the example shown in FIG. 15, the guide devices 3 and/or main paths H directly lead to the connecting devices 14 in an acute angle (that is, an angle which is less than 90°), in particular with respect to the longitudinal extension or side/edge of the preferably strip-like and/or rectangular (connected) connecting device 14. It is also possible that the guide devices 3 and/or main paths H directly lead to the connecting devices 14 parallel to the longitudinal extension or side/edge of the preferably strip-like and/or rectangular (connected) connecting device 14.

Guide devices 3 which are arranged on top of one another and connected in parallel are preferably arranged as a row between two preferably block-like connecting devices 14, in particular wherein the guide devices of a row are separated by intermediate layers 16. The intermediate layers 16 are preferably formed by or comprise insulating and/or semiconducting material, for example air or an insulating solid. The intermediate layers 16 can be made of the same or a different material as the intermediate regions 15.

The lateral extension or width D1 of a connecting device 14 is can be larger, equal to or smaller than the lateral extension or width D2 of a guide device 3.

The vertical extension or height V1 of a guide device 3 can be larger, equal to or smaller than the vertical distance V2 of two guide devices 3 which are connected in parallel. The vertical distance V2 preferably corresponds to the height or vertical extension of the intermediate layers 16.

Manufacturing of a device 1 with a plurality of guide devices 3 and/or connecting devices 14 can be performed in such a way that a plurality of guide devices 3 are produced at the same time or simultaneously, for example by self-structuring or by an epitaxial procedure.

As an alternative or in addition, any known techniques from semiconductor device fabrication can be used for or form part of the fabrication of the device 1, in particular photolithography, chemical and/or physical vapor deposition, sputtering and/or etching.

The device 1 preferably forms a semiconductor device and/or an integrated circuit.

In the following, further embodiments of the present invention will be discussed with reference to FIGS. 17 to 22. These embodiments in particular differ from the embodiments described with reference to FIGS. 1 to 16 by the design of the movement region B, in particular the materials used for forming the movement region B. However, features of the embodiments described with reference to FIGS. 17 to 22 can preferably be combined with features of the embodiments described with reference to FIGS. 1 to 16.

As an alternative or in addition to the previously discussed possibilities of a two-dimensional electron gas or a superconducting layer 11 for forming the movement region B, the guide device 3 can have or form any other material exhibiting a sufficiently large mean free path length for the carriers 2, in particular a nanotube or one or several single, preferably two-dimensional, atomic layers formed of covalently bonded atoms or layers of a van der Waals heterostructure, particularly preferably a—preferably at least essentially two-dimensional—modification or allotrope of carbon or another element of the carbon group or fourth main group of the periodic table of elements.

Figure 17:
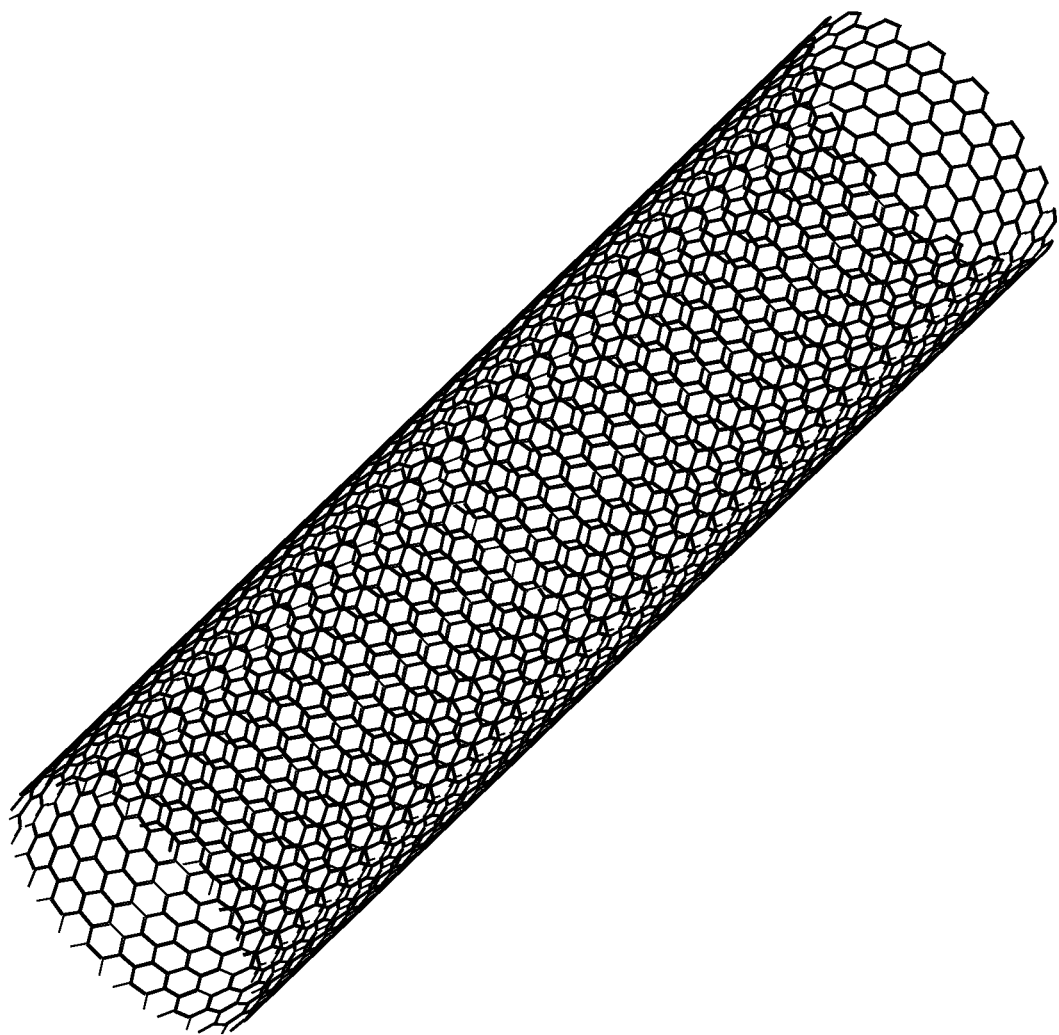
FIG. 17 shows a schematic perspective view of a nanotube for illustrative purposes.

Preferably, the material forming the movement region B, in particular a van der Waals material or carbon, has a hexagonal crystal structure. Particularly preferred examples are graphene and carbon nanotubes. For illustrative purposes, a cylindrical (carbon) nanotube is schematically shown in FIG. 17. The hexagonal crystal structure is indicated in FIGS. 17 to 20.

However, other materials or mixtures or combinations of materials, in particular two-dimensional materials, having a sufficiently large mean free path length for the carriers 2, preferably similar or larger than the mean free path length in graphene and/or carbon nanotubes, can in principle also be used for forming the guide device 3 or movement region B.

Such large mean free path lengths are observed in many two-dimensional materials such as van der Waals materials/heterostructures, semiconductor-sandwiches or nanotubes and graphene. That is why such two-dimensional structures have been used for the theoretical description and the experimental demonstration. However, the present invention will work with any material which exhibits mean free path lengths to the same order of magnitude which characterizes the radius of curvature R of the guide device 3, the movement region B and/or the main path H, wherein the material at the same time has at least a fraction of non-specular or non-sine-type reflections at the boundaries or flanks 9.

The terms "modification" and "allotrope" denote the appearance of the element or substance with a certain crystal structure. Herein, the terms "modification" and "allotrope" are preferably used synonymously and/or are interchangeable. Different modifications or allotropes of an element or substance differ by their crystal structure. To give an example, some of the modifications or allotropes of carbon are diamond, graphite, graphene, carbon nanotubes and fullerenes.

The term "two-dimensional materials" in particular denotes materials comprised of a single layer, in particular a single atomic layer. Examples for two-dimensional materials are, among many others, hexagonal boron nitride, stanene, germanene and silicene. However, a two-dimensional material or single layer can also comprise several atomic layers of the same or different chemical elements which are in particular covalently bonded.

The term "van der Waals heterostructure" preferably denotes a material or structure comprising several layers formed from covalently bonded atoms, wherein interlayer bonding is only weak, in particular of the van der Waals type. Van der Waals heterostructures can be formed from layers formed from the same materials or from layers formed from the same materials. In other words, a van der Waals heterostructure can be formed from a plurality of identical layers or from an arbitrary combination of different layers. The layers of a van der Waals heterostructure are preferably formed from two-dimensional materials.

A single covalently bonded layer of a van der Waals heterostructure can comprise one atomic layer or several atomic layers. A single covalently bonded layer of a van der Waals heterostructure can comprise only atoms of the same chemical element as well as atoms of different chemical elements.

Materials which can form or be used for van der Waals heterostructures are also called "van der Waals materials". The terms "van der Waals material" and "van der Waals heterostructure" are preferably used synonymously herein and/or are exchangeable.

Graphite is an example for a van der Waals heterostructure or material comprising single layers which are formed from a single atomic layer containing only carbon atoms, such a single atomic layer being called "graphene".

Examples for van der Waals heterostructures or materials in which one layer is formed from several atomic layers are transition metal dichalcogenides (TMDCs), for example $MoS_2$, $MoSe_2$, $WS_2$ or $WSe_2$, in which a single layer is formed from one atomic layer of a transition metal, for example Mo or W, and two atomic layers of a dichalcogenide, for example Se or S. The transition metal layer and the dichalcogenide layers are covalently bonded to each other such that they form a single layer which is only weakly bonded to other single layers by van der Waals interactions.

Large mean free path lengths for carriers 2, in particular electrons, have been observed in a variety of van der Waals materials or two-dimensional materials.

However, in general, any material which exhibits large mean free path lengths for the carriers 2 in the bulk together with at least partially inelastic collisions or scattering at boundaries and/or in the bulk of the material can be used for forming the guide device 3 or movement region B.

The term "nanotube" in particular denotes a tube or tube-like object with a size in the nanometer range. Preferably, the wall of a nanotube is formed by a single atomic layer. A linear extending nanotube preferably forms a cylinder with a central or longitudinal axis, the wall of the cylinder in particular being formed by a single atomic layer and surrounding the central or longitudinal axis with a constant distance. Nanotubes comprising a wall formed by a single atomic layer have been shown to exhibit large mean free paths lengths inside the atomic layer.

Graphene is a two-dimensional modification of carbon in which the carbon atoms form a single atomic layer with a hexagonal crystal structure. The carbon atoms of graphene are $sp^2$-hybridized so that each carbon atom is bonded to three other carbon atoms, in particular within the same plane, which are arranged in angles of 120° to each other. The crystal structure of graphene is indicated in FIG. 17. Graphene is known for exhibiting large mean free path lengths.

Carbon nanotubes are tubes having walls comprised of carbon atoms arranged in the same hexagonal structure as in graphene. In other words, carbon nanotubes can be understood or imagined as a preferably rectangular strip of graphene which has been bent to a in particular cylindric tube, wherein two edges have been (chemically) connected or bonded to form a continuous wall of the nanotube.

In the following, carbon-based materials are—for simplicity—used as a particularly preferred example for forming the movement region B. The further embodiments are in particular explained with reference to layers or strips of graphene and with reference to carbon nanotubes.

However, other elements of the fourth main group or carbon group of the periodic table of elements can form modifications, in particular mono-atomic layers and/or nanotubes, preferably with a hexagonal crystal structure, similar to graphene and carbon nanotubes. Thus, in the following embodiments, layers, strips and/or nanotubes formed from elements of the fourth main group or carbon group of the periodic table of elements other than carbon can thus also be used instead of graphene and/or carbon nanotubes.

Further, the following explanations also apply to embodiments in which the one or several graphene strips or layers are replaced by one or several strips or layers of another material, in particular a two-dimensional material or van der Waals heterostructure or any other material comprising a sufficiently long mean free path length for the carriers 2 in the bulk, which in particular comprises or exhibits at least partially inelastic collisions or scattering at boundaries and/or in the bulk of the material.

Likewise, the following explanations also apply to embodiments in which the one or several carbon nanotubes are replaced by one or several nanotubes of another material, in particular a two-dimensional material or van der Waals heterostructure or any other material comprising a sufficiently long mean free path length for the carriers 2 in the bulk, which in particular comprises or exhibits at least partially inelastic collisions or scattering at boundaries and/or in the bulk of the material.

Figure 18:
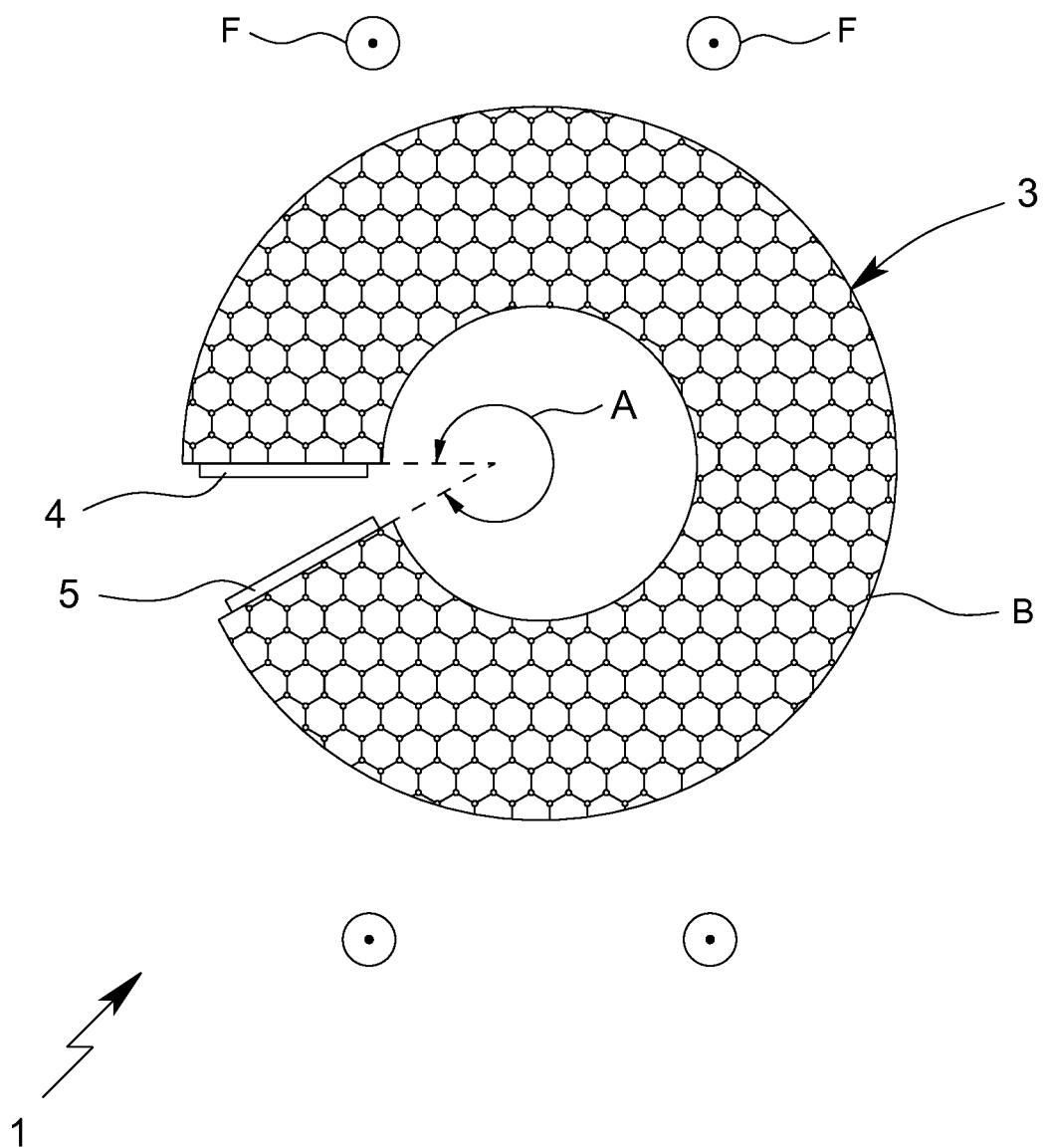
FIG. 18 shows a schematic section through a movement region of a proposed device according to an eleventh embodiment.

FIG. 18 schematically shows an eleventh embodiment in which the movement region B or guide device 3 is preferably formed by or comprises one or several, in particular at least essentially plane or flat, layers or strips of a van der Waals heterostructure or a layer thereof or a material based on a chemical element of the element of the fourth main group of the periodic table of elements, in particular of graphene. In the eleventh embodiment, the movement region B or guide device 3 preferably lies in a single plane. Preferably, the graphene strip or layer is annular or ring-like and/or forms a, preferably circular, section of a ring.

The field-generating means 10 (not shown in FIGS. 18 to 22) is preferably adapted to create or apply the field F perpendicular to the plane of the movement region B and/or to the graphene strips/layer(s) or the plane defined by the latter, as indicated in FIG. 18.

Figure 19:
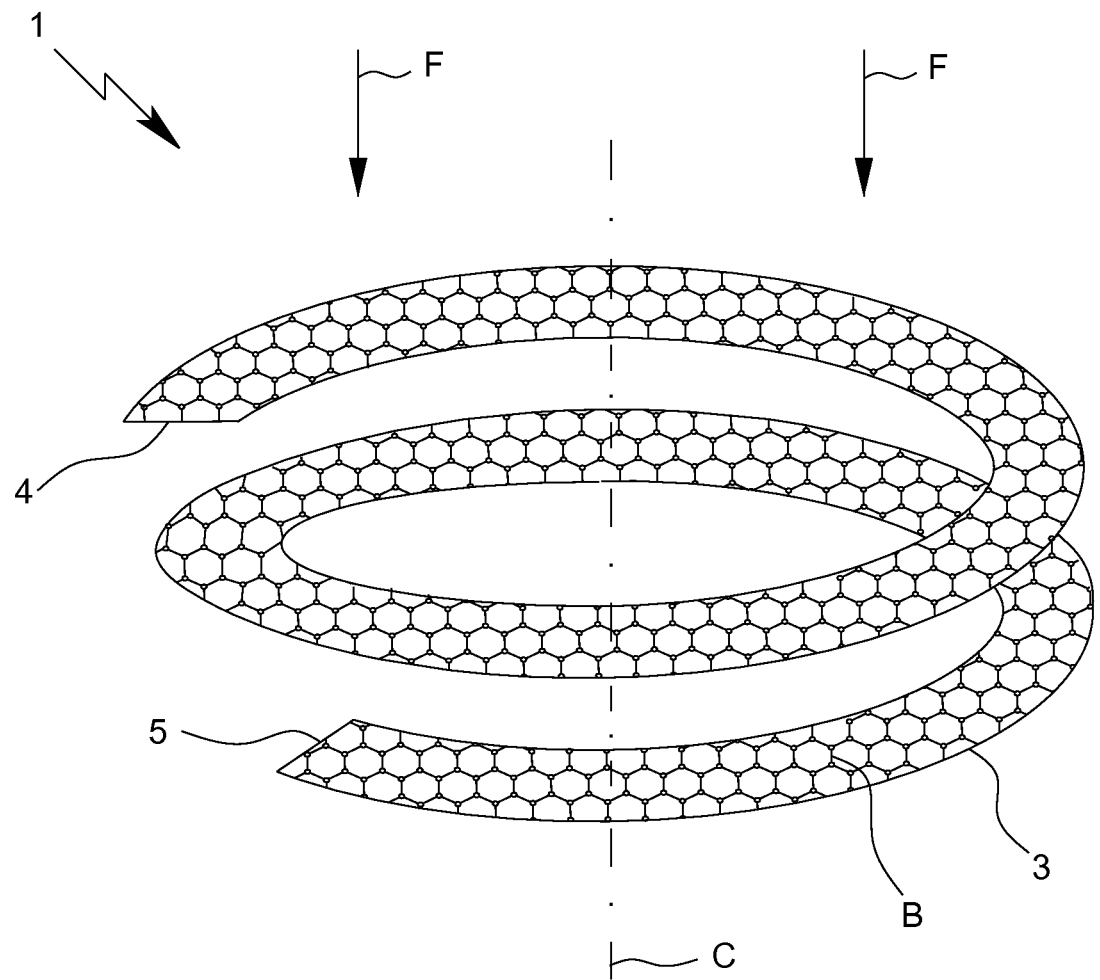
FIG. 19 shows a schematic perspective view of a proposed device according to a twelfth embodiment.

FIG. 19 schematically shows a twelfth embodiment to which the above explanations concerning the eleventh embodiment preferably also apply.

In the twelfth embodiment, the movement region B or guide device 3 is preferably formed by at least one layer or strip of graphene which forms a helix, in particular around a common or central axis C. In particular, the guide device 3 or movement region B is arranged screw-like or helix-like and/or forms a corkscrew way.

A "helix" preferably is a structure or object winding around a linear and/or central axis with a constant distance to that axis. A helix preferably winds around the axis with a constant slope.

As an alternative, which is not shown in FIG. 19, the movement region B or guide device 3 can preferably be formed by at least one layer or strip of graphene which forms a spiral, in particular around the axis C. In particular, the guide device 3 or movement region B is arranged spiral-like.

A "spiral" preferably is a structure or object winding around a point or linear and/or central axis with a decreasing or increasing distance to that point or axis. Two-dimensional spirals extend in a plane, whereas three-dimensional spirals extend in a direction parallel to the axis.

Figure 20:
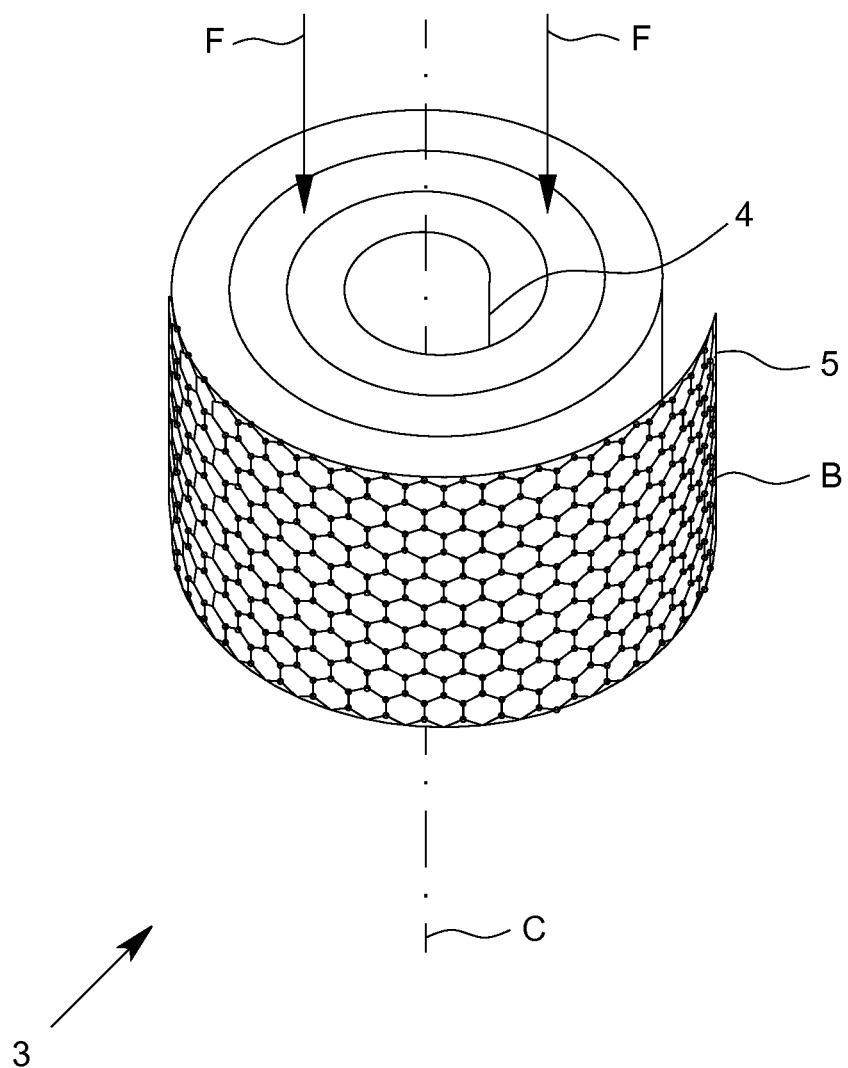
FIG. 20 shows a schematic perspective view of a proposed device according to a thirteenth embodiment.

The graphene layer or strip shown in FIGS. 18 to 20 preferably has a preferably constant width and a length, the length being larger or a multiple of the width.

Preferably, the graphene layer or strip is arranged such that the width extends perpendicular to the axis C.

Preferably, different sections of the movement region B or guide device 3 are arranged on top of another along the direction of the axis C in this case. A surface or flat side of the graphene layer/strip and/or a plane defined thereby is preferably arranged at least essentially perpendicularly to the axis C.

Preferably, the slope of the helix-like or spiral-like movement region B or guide device 3, in particular the graphene layer or strip, is less than 10°, more preferably less than 5°, particularly less than 2°, in particular less than 1°.

The field-generating means 10 is preferably adapted to create or apply the field F parallel to the axis C and/or at least essentially perpendicular to the plane of the movement region B and/or to the graphene layer(s) or the plane defined by the latter, as indicated in FIG. 19. Preferably, the angle between the field F and the plane of the movement region and/or graphene layer or strip derives less than 10°, more preferably less than 5°, particularly less than 2°, in particular less than 1° from a right angle.

FIG. 20 schematically shows a thirteenth embodiment. In this embodiment, the movement region B or guide device 3 is preferably formed by spiral or a rolled-up layer or strip of graphene.

The guide device 3 or movement region B, in particular the graphene layer or strip, is preferably bent or arranged spiral-like around a central or common axis C. Preferably, a flat side, surface and/or the width of the graphene layer or strip is arranged parallel to the axis C. In particular, the flat side or surface of the graphene layer or strip is bent such that the layer or strip does not define a plane.

The field-generating means 10 is preferably adapted to create or apply the field F parallel to the axis C and/or parallel to a flat side or surface of the graphene layer or strip. One of the connections 4, 5 is preferably arranged at an inner end and the other of the connections 4, 5 is preferably arranged at an outer end of the rolled-up layer or strip.

Figure 21:
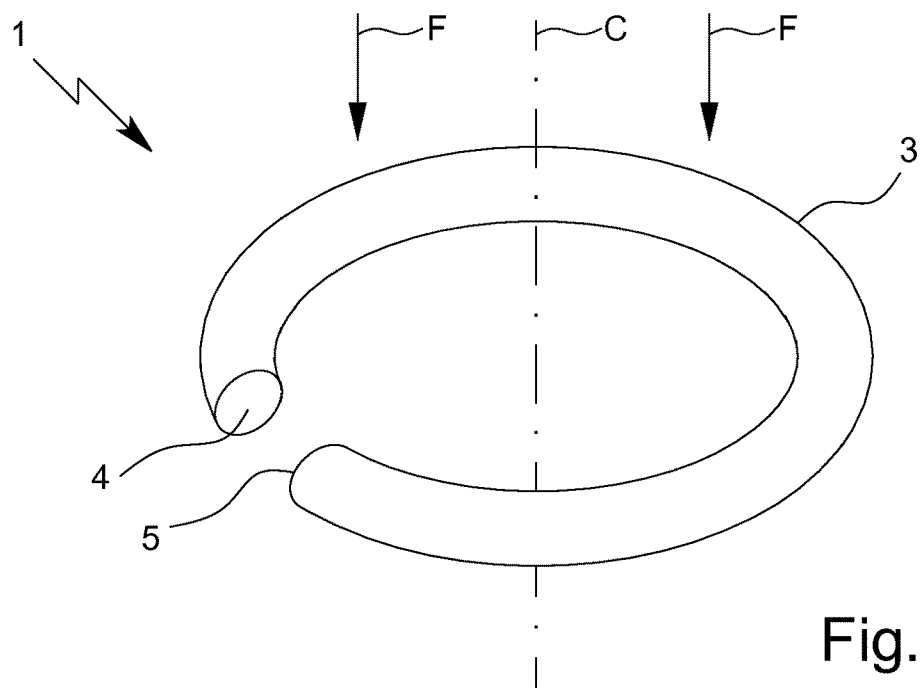
FIG. 21 shows a schematic perspective view of a proposed device according to a fourteenth embodiment.

FIG. 21 schematically shows a fourteenth embodiment. In the fourteenth embodiment, the movement region B or guide device 3 comprises or is formed by a preferably curved, angled or bent nanotube, in particular carbon nanotube, or several such nanotubes.

The (carbon) nanotube shown in FIG. 21, in particular its longitudinal axis, is particularly bent or shaped as a ring or a section of a ring and/or not linearly extending. Preferably, the nanotube and/or its longitudinal axis is arranged at least essentially perpendicular to a central or common axis C and/or winds or bends around the axis C.

Preferably, the fourteenth embodiment only differs from the eleventh embodiment in that the movement region B or guide device 3 is formed by one or several nanotubes instead of one or several at least essentially plane graphene layers or strips. Thus, the explanations made in connection with the eleventh embodiment preferably also apply to the fourteenth embodiment.

Figure 22:
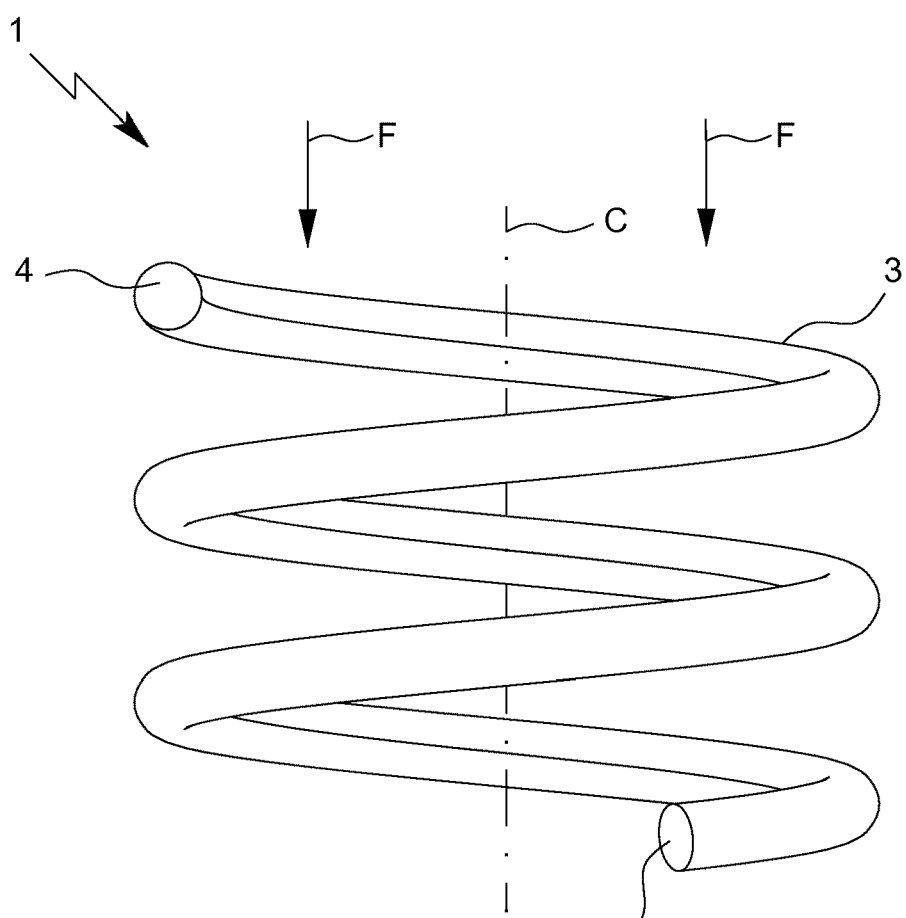
FIG. 22 shows a schematic perspective view of a proposed device according to a fifteenth embodiment.

According to a fifteenth embodiment which is shown in particular in FIG. 22, the (carbon) nanotube forming the movement region B or guide device 3 or its longitudinal axis can also form a spiral or helix around the axis C. In FIG. 22, the nanotube is helix-like or formed as a helix. However, it is also possible that the nanotube is spiral-like and/or formed as a spiral, as already explained with reference to FIG. 19.

In the fourteenth and fifteenth embodiment, the field-generating means 10 is preferably adapted to create or apply the field F parallel to the axis C and/or at least essentially perpendicular to the nanotube and/or its longitudinal axis.

Preferably, the fifteenth embodiment is similar to the twelfth embodiment, wherein a (carbon) nanotube is used instead of a (graphene) layer or strip. All other features explained in connection with the twelfth embodiment preferably also apply to the fifteenth embodiment.

The spirals and/or helices of the twelfth, thirteenth and/or fifteenth embodiment can also form several guide devices 3 and/or movement regions B, in particular similar or identical to the eighth and/or ninth embodiment and/or as explained with reference to FIGS. 13 and 14.

According to further embodiments which are not shown in the figures, it is in principle also possible to use other materials which are similar to graphene, for example silicene, germanene or stanene, for forming the movement region B or guide device 3. Likewise, as an alternative to carbon nanotubes, nanotubes formed of silicon, germanium or tin atoms can in principle be provided.

In general, it should be noted that, by means of the present invention, more precisely the device 1 according to the invention and the method according to the invention, an asymmetrical or direction-dependent conductivity can be or is generated (also called "nano-ratchet") and, accordingly, an electrical current, an electrical voltage, and/or an electrical power can be tapped or made available. In particular, a conversion of kinetic or thermal energy into electrical energy is made possible in a simple and efficient and/or direct manner.

Figure 23:
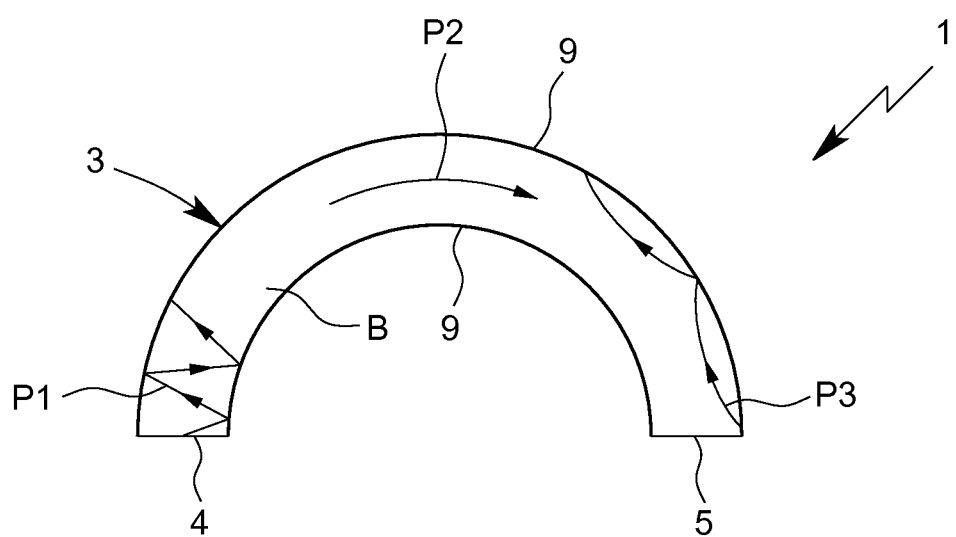
FIG. 23 shows schematically different paths for the carriers in a proposed device.

In the following, the working principle of the device 1 is again explained with reference in particular to FIG. 23 which very schematically shows the device 1. In FIG. 23, a semi-circular movement region B with connections 4 and 5 is displayed. In addition, different paths P1, P2, P3 for the carriers 2 along the movement region B or main path H are indicated.

In particular, movement of the carriers 2 in the device 1 or guide device 3 is preferably determined by the initial direction of movement of the carriers 2, by the external field F acting on the carriers 2, by the number and type of reflections of the carriers 2 at the flanks 9, and/or by the number and type of scattering events in the movement region B or along the main path H.

Without an external field F, the transmission probability for carriers 2 moving from connection 4 to connection 5 is the same as for carriers moving in the opposite direction, i.e. from connection 5 to connection 4.

Assuming, for example, only "specular" reflection at the flanks 9 (i.e., angle of incidence equal to angle of reflection) and no scattering along the movement region B or main path H, the carriers 2 which are reflected at the flanks 9 follow the path P1 which is schematically indicated in FIG. 23. In case of specular reflection at the flanks 9, the carriers 2 always move in the same direction along the movement region B or main path H ("forward", from connection 4 to connection 5 in FIG. 23), because reversal of the movement direction does not take place during specular reflections at the flanks 9, but the component of movement which is parallel to the flank 9 is conserved as the angle of incidence is equal to the angle of reflection.

When an external static field F, for example a magnetic field, is applied, the previous straight trajectories of the carriers 2 become curved trajectories (indicated as P2 and P3 in FIG. 23). A carrier 2 starting at connection 4 will move without or at least with very few reflections at the flanks 9 to the connection 5, provided that the external field is adjusted accordingly. This is shown by the path P2 in FIG. 23. Accordingly, the length of the path which the carrier 2 takes from connection 4 to connection 5 is quite short. A carrier 2 starting at connection 5 under the same conditions will be able to move to connection 4 only with many reflections at the flanks 9 so that the length of the path the carrier 2 takes from connection 5 to connection 4 is quite long, accordingly.

Thus, the sum of the lengths of the paths P3 which a plurality of carriers 2 take from connection 5 to connection 4 is preferably much longer than the sum of the lengths of the paths P2 of carriers 2 moving from connection 4 to connection 5.

Further, the flanks 9 can be at least partially diffusely scattering and/or reflecting at least partially non-specular manner and/or in a manner in which the probability of reflection to a certain angle does not follow a sine or cosine function, as mentioned above. At such a non-specular reflection, the movement component of the carrier 2 parallel to the flank 9 can be changed or reversed so that the carrier 2 can even be scattered "back", i.e. in a direction opposite the direction of movement of the carrier 2 before the reflection or scattering. Further, the geometrical path which a carrier 2 takes from connection 5 to connection 4 is longer than the geometrical path from connection 4 to connection 5. With a longer path of the carrier 2 within the movement region B, the probability for further scattering events within the movement region B grows. In these further scattering events, the carrier 2 can also be scattered back.

By using a material with a sufficient mean-free path length for the carriers 2 in the movement region B or main path H, the probability for scattering is extremely low. In conventional materials with a small mean free path length for the carriers 2, a carrier 2 on the way from connection 4 to connection 5 would undergo a large number of scattering events so that preferably no statistically relevant or measurable difference would be realized between the lengths of the path taken by carriers 2 on the way from connection 4 to connection 5 and carriers 2 on the way from connection 5 to connection 4.

Thus, in conclusion, in the device 1 according to the proposal, a previously ergodic system (without external field F) is transformed to a non-ergodic system when an appropriate external field F is applied, the system having different transmission probabilities for carriers 2 moving from connection 4 to connection 5 then for carriers 2 moving from connection 5 to connection 4. Thus, the probability of presence for carriers 2 at the connection 5 is different, in the discussed example according to FIG. 23 higher, than the probability of presence for carriers 2 at the connection 4. This preferably leads to different, in particular electric, charges at the connections 4, 5 and to voltages or electric powers which can be tapped via the connections 4, 5.

As mentioned previously, individual aspects and features of the present invention and its various embodiments can be implemented individually and combined with one another as desired.

LIST OF REFERENCE SYMBOLS 1 device
2 carrier
3 guide device
4 connection
5 connection
6 layer/solid body
7 layer/solid body
8 boundary surface
9 flank
10 field-generating means
11 superconducting layer
12 leg
13 connection element
14 electrode/connecting device
15 intermediate region
16 intermediate layer
A central angle
B movement region
C common axis
D1 lateral extension/width (connecting device)
D2 lateral extension/width (guide device)
E plane
F field
H main path
P1 path
P2 path
P3 path
R radius of curvature
V1 vertical extension/height (guide device)
V2 vertical distance
W mean width
Z gyroradius of the carriers

The invention claimed is:

1. A device for guiding carriers, each of which has an electrical charge and/or a magnetic moment, particularly charge carriers, with a guide device for movably guiding the carriers in an at least substantially laminar movement region with a curved or angled main path for the carriers,
    with electrical connections arranged along the main path, and
    with a field-generating means for generating a field for guiding the carriers at least substantially along the main path, particularly so that electrical volt age or power can be tapped at the electrical connections and/or the carriers have a different probability density/presence density at the electrical connections,
    wherein the guide device has or is formed by a modification of carbon with a hexagonal crystal structure for forming the movement region, and/or the guide device has or is formed by one or several layers of a van der Waals heterostructure for forming the movement region, and/or the guide device has or is formed by a nanotube for forming the movement region, and/or the guide device has or is formed by a material which exhibits large mean free path lengths for the carriers in the bulk together with at least partially inelastic collisions or scattering at boundaries and/or in the bulk of the material.

2. The device according to claim 1, wherein the guide device has or is formed by a preferably two-dimensional modification of an element of the fourth main group of the periodic table of elements with a hexagonal crystal structure for forming the movement region.

3. The device according to claim 1, wherein the nanotube is formed from an element of the fourth main group of the periodic table of elements.

4. The device according to claim 1, wherein the guide device has or is formed by one or several strips or layers of graphene for forming the movement region.

5. The device according to claim 1, wherein the guide device has or is formed by one or several graphene strips or layers shaped as a spiral or helix for forming the movement region.

6. The device according to claim 1, wherein the guide device has or is formed by one or several carbon nanotubes for forming the movement region.

7. The device according to claim 1, wherein the guide device has or is formed by one or several carbon nanotubes shaped as a spiral or helix for forming the movement region.

8. The device according to claim 1, wherein the device comprises several guide devices having or being formed by one or several graphene strips or layers shaped as a spiral or helix for forming the movement region.

9. The device according to claim 1, wherein the device comprises several guide devices having or being formed by one or several carbon nanotubes shaped as a spiral or helix for forming the movement region.

10. The device according to claim 1, wherein the device comprises several guide devices and/or main paths which are arranged helix-like on top of one another along a common axis.

11. The device according to claim 1, wherein the device comprises a multitude of guide devices in a common plane, the guide devices being connected serially and/or in parallel.

12. A device for guiding carriers, each of which has an electrical charge and/or a magnetic moment, particularly charge carriers, with a guide device for movably guiding the carriers in an at least substantially laminar movement region with a curved or angled main path for the carriers,
    with electrical connections arranged along the main path, and
    with a field-generating means for generating a field for guiding the carriers at least substantially along the main path, particularly so that electrical volt age or power can be tapped at the electrical connections and/or the carriers have a different probability density/presence density at the electrical connections,
    wherein the device comprises several guide devices and/or main paths which are arranged helix-like on top of one another along a common axis, and/or the device comprises a multitude of guide devices in a common plane, the guide devices being connected serially and/or in parallel, and/or the device comprises several guide devices and/or main paths which are connected serially and/or in parallel by strip-like connecting devices, wherein the guide devices and/or main paths directly lead to the connecting devices in an acute angle or parallel to the longitudinal extension of the connected connecting device(s), and/or the guide device comprises a layer system of differently doped semiconductors or semiconductor materials, which in particular form a two-dimensional electron gas at the interface between them, the layer system preferably comprising at least one layer of InGaAs and/or at least one layer of InP so that a two-dimensional electron gas is formed at the interface.

13. The device according to claim 12, wherein the device comprises multiple planes, wherein a multitude of guide devices are arranged in each plane and connected serially and/or in parallel.

14. The device according to claim 12, wherein more than 1,000 guide devices are connected in parallel and more than 100 guide devices are connected serially.

15. The device according to claim 12, wherein guide devices that are adjacent to one another are separated in the same plane by intermediate regions.

16. The device according to claim 12, wherein guide devices that are adjacent to one another are separated from one plane to the other by intermediate layers.

17. The device according to claim 12, wherein the guide device and/or the movement region and/or main path extends at least substantially in a plane or along a closed surface and is curved and/or angled in this plane or surface.

18. The device according to claim 12, wherein the guide device has two layers or solid bodies, lying particularly flat on top of one another, with different Fermi levels, with the movement region and/or the two-dimensional electron gas being formed on or along the boundary surface thereof.

19. The device according to claim 12, wherein the guide device has or forms several movement regions and/or or electron gases and/or superconducting layers lying flat on top of one another.

20. The device according to claim 12, wherein a flank or flanks of the movement region for the carriers are configured so as to be at least partially diffusely scattering and/or not exclusively specular.

21. The device according to claim 12, wherein a mean width of the movement region and the radius of curvature of the main path correspond at least substantially to or are less than the mean free path length of the carriers in the movement region.

22. The device according to claim 12, wherein the mean free path length of the carriers in the movement region is more than 25% of the length of the main path or the distance between the connections along the main path.

23. The device according to claim 12, wherein the guide device and/or the movement region is singly or multiply angled and/or arcuate or semicircular at least in some areas.

24. The device according to claim 12, wherein a radius of curvature of the guide device and/or of the movement region is greater than 100 nm and less than 2000 nm.

25. The device according to claim 12, wherein a radius of curvature of the main path is greater than 100 nm and less than 2000 nm.

26. The device according claim 12, wherein the field-generating means is configured to generate a magnetic field.

27. The device according to claim 12, wherein the field-generating means or the field for guiding the carriers is adapted or can be set or controlled in consideration of a mean speed of the carriers such that the carriers are guided on trajectories with radii of curvature on the order of magnitude of the radius of curvature of the main path and/or movement region and/or guide device.

28. A method of using the device according to claim 12 for generating electrical voltage or power from the thermal or heat energy from charge carriers and/or from the electromagnetic inherent or ambient noise of charge carriers, with the voltage or power being tapped via the connections, particularly with the field being held at least substantially constant.

29. A method of using the device according to claim 12 for cooling through the removal of thermal or heat energy of the charge carriers by tapping electrical power via the connections, with the field being particularly held at least substantially constant.

30. A method of using the device according to claim 12 for measuring or determining scattering or trajectories of charge carriers and/or for measuring or detecting electromagnetic radiation, by measuring electrical current via the connections, with the field being particularly held at least substantially constant.

31. A method of using the device according to claim 12 for measuring or determining physical characteristics within a one- or two-dimensional electron gas or superconductor.

32. A method of using the device according to claim 12, wherein magnetic field strengths acting on the guide device (s) are detected or measured by measuring an electrical voltage via the connections and determining the magnetic field strength(s) therefrom.

* * * * *